United States Patent
Kataoka et al.

(10) Patent No.: US 9,628,110 B2
(45) Date of Patent: Apr. 18, 2017

(54) COMPUTER-READABLE RECORDING MEDIUM, ENCODING APPARATUS, ENCODING METHOD, COMPARISON APPARATUS, AND COMPARISON METHOD

(71) Applicant: FUJITSU LIMITED, Kawasaki-shi, Kanagawa (JP)

(72) Inventors: Masahiro Kataoka, Kamakura (JP); Ryo Matsumura, Numazu (JP); Takaki Ozawa, Numazu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/209,978

(22) Filed: Jul. 14, 2016

(65) Prior Publication Data
US 2017/0019126 A1 Jan. 19, 2017

(30) Foreign Application Priority Data
Jul. 16, 2015 (JP) ................. 2015-142498

(51) Int. Cl.
H03M 7/30 (2006.01)
G06F 17/22 (2006.01)
G06F 17/30 (2006.01)
G06F 17/27 (2006.01)

(52) U.S. Cl.
CPC ...... *H03M 7/3084* (2013.01); *G06F 17/2217* (2013.01); *G06F 17/2735* (2013.01); *G06F 17/30628* (2013.01)

(58) Field of Classification Search
None
See application file for complete search history.

(56) References Cited

U.S. PATENT DOCUMENTS

| 5,138,669 A | 8/1992 | Shimura et al. | |
| 5,850,565 A * | 12/1998 | Wightman | H03M 7/3084 710/1 |
| 5,872,530 A * | 2/1999 | Domyo | H03M 7/3088 341/106 |
| 5,951,623 A * | 9/1999 | Reynar | G06T 9/005 341/106 |

(Continued)

FOREIGN PATENT DOCUMENTS

| JP | 4-123619 | 4/1992 |
| JP | 4-274557 | 9/1992 |

(Continued)

*Primary Examiner* — Howard Williams
(74) *Attorney, Agent, or Firm* — Oblon, McClelland, Maier & Neustadt, L.L.P.

(57) ABSTRACT

The encoding apparatus registers, in a dynamic dictionary, strings in input text data that are not contained in a static dictionary. The encoding apparatus adds, to first hashed data obtained by individually N-dimensionally hashing words contained as registered items in the static dictionary, hashed data obtained by individually hashing strings registered in the dynamic dictionary. The encoding apparatus 100 determines, by using the first hashed data, whether each input string has been registered in the static dictionary 124 and whether the string has been registered in the dynamic dictionary 122. In accordance with the result of the determination, the encoding apparatus 100 performs encoding based on a content registered in the static dictionary or the dynamic dictionary.

10 Claims, 15 Drawing Sheets

(56) References Cited

U.S. PATENT DOCUMENTS

| | | | | |
|---|---|---|---|---|
| 7,982,636 B2* | 7/2011 | Abali | ............... | H03M 7/3088 |
| | | | | 341/51 |
| 8,200,641 B2* | 6/2012 | Jayaraman | ........ | G06F 17/30156 |
| | | | | 341/51 |
| 8,872,677 B2* | 10/2014 | Litvak | ............... | H03M 7/3084 |
| | | | | 341/106 |

FOREIGN PATENT DOCUMENTS

| | | |
|---|---|---|
| JP | 5-252049 | 9/1993 |
| JP | 10-261969 | 9/1998 |

* cited by examiner

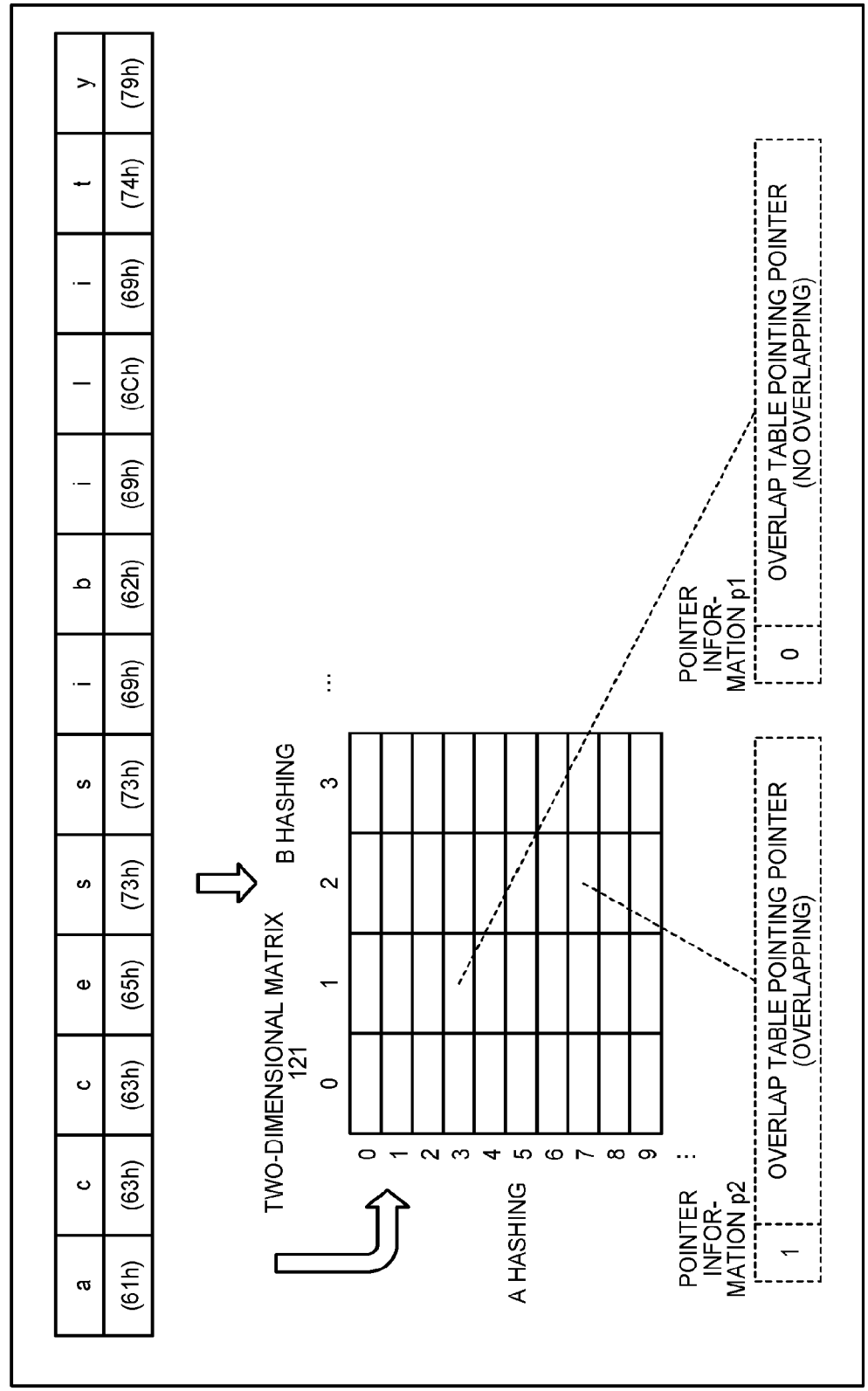

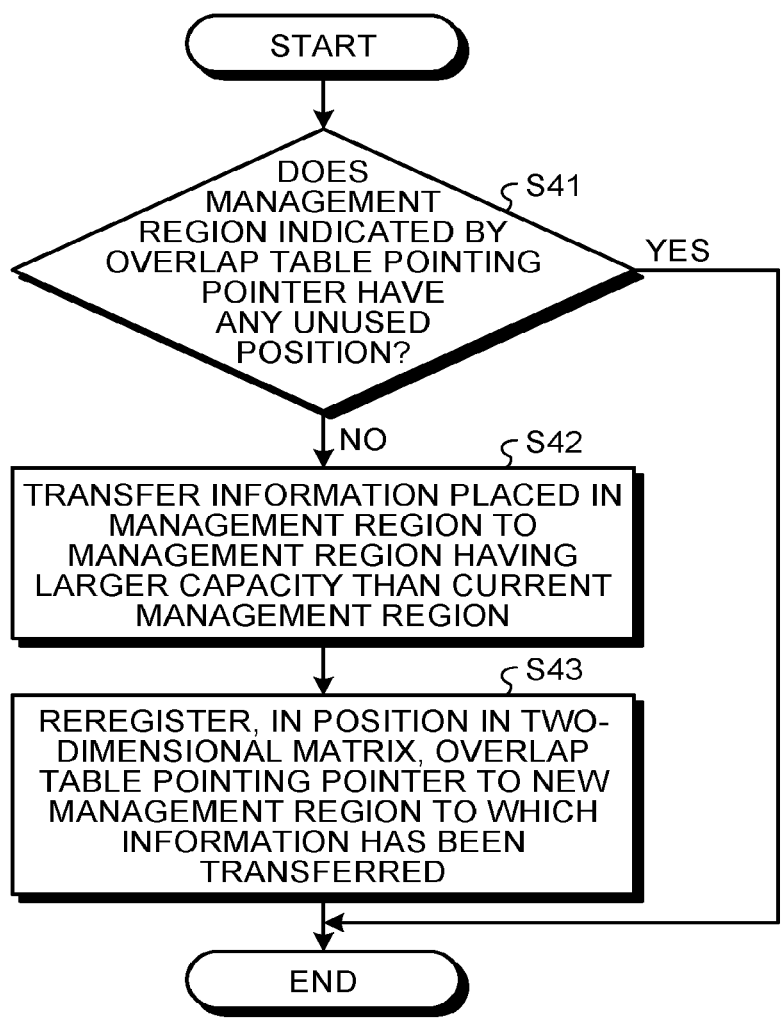

COMPUTER-READABLE RECORDING MEDIUM, ENCODING APPARATUS, ENCODING METHOD, COMPARISON APPARATUS, AND COMPARISON METHOD

CROSS-REFERENCE TO RELATED APPLICATION(S)

This application is based upon and claims the benefit of priority of the prior Japanese Patent Application No. 2015-142498, filed on Jul. 16, 2015, the entire contents of which are incorporated herein by reference.

FIELD

The embodiment discussed herein is related to, for example, a computer-readable recording medium.

BACKGROUND

In the LZ77 encoding (for example, ZIP and GZIP), search for the longest matching string is executed using a sliding window, and the address and the string length are assigned to a compression code. For example, in the case of GZIP, comparison for whether each string to be compressed matches any string in a sliding window is made using a bigram hash table and a linked list. Related art examples are disclosed in Japanese Laid-open Patent Publication No. 05-252049, Japanese Patent No. 3038233, Japanese Laid-open Patent Publication No. 10-261969, and Japanese Laid-open Patent Publication No. 04-274557.

SUMMARY

In English sentences, however, the distribution of characters appearing in the leading bigrams is skewed and therefore causes a collision in a bigram hash table, and an expression based on a linked list is inevitably used, resulting in the problem that a volume of processing is consequently increased, which slows down the speed of code assignment.

Here, the problem of resulting in an increased volume to be processed, which reduces the speed of assigning codes, is described with reference to FIG. 1. FIG. 1 is a diagram illustrating a reference example of the structures of a hash table and a linked list. For example, GZIP has a buffer provided with a structure containing a hash table and a linked list, as illustrated in FIG. 1. A hash value is generated from the leading α symbols of a string. In one example, α is 2 in the case of the bigram method. In GZIP, strings having the same hash value are linked in the order of appearance in the form of list by use of the linked list. The head pointer of the linked list is saved in the hash table. Subsequently, with respect to strings to be compressed, hash values are generated from the leading symbols thereof, and, if a string has a hash value of the same value as another string, the longest matching string is found by scanning the list and confirming that the string having the hash value is the same as another string in the buffer. After the longest matching string is found, the address and the string length of the longest matching string are assigned as a compression code.

In the bigram method, however, the distribution of characters corresponding to the leading bigrams is skewed, and therefore some hash values generated from the leading bigrams of strings may collide with each other, depending on the bigram distribution. When a collision between hash values occurs, the longest matching string is found by scanning a linked list corresponding to the hash value sequentially from the beginning point thereof. Thus, when hash values collide, a volume of processing increases for a process of finding the longest matching string by scanning a linked list corresponding to hash values, sequentially from the beginning point thereof. Consequently, the speed of the code assigning process slows down.

BRIEF DESCRIPTION OF DRAWINGS

FIG. 2A is a diagram illustrating an example of the procedure of an encoding process according to an embodiment;

FIG. 7 is a diagram illustrating an example of a flowchart for a process of transfer from one management region to another;

SUMMARY

According to an aspect of an embodiment, a non-transitory computer-readable recording medium stores an encoding program. The program causes a computer to execute a process. The process includes registering, in a dynamic dictionary, strings in input text data that are not contained in a static dictionary; adding, to first hashed data obtained by individually N-dimensionally hashing words contained as registered items in the static dictionary, hashed data obtained by individually hashing strings registered in the dynamic dictionary; determining, by using the first hashed data, whether each input string has been registered in the static dictionary and whether the string has been registered in the dynamic dictionary; and in accordance with a result of the determining, performing encoding based on a content registered in the static dictionary or the dynamic dictionary.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiments of the present invention will be explained with reference to accompanying drawings. This embodiment is not intended to limit the present invention.

Encoding Process According to the Embodiment

Figure 1:
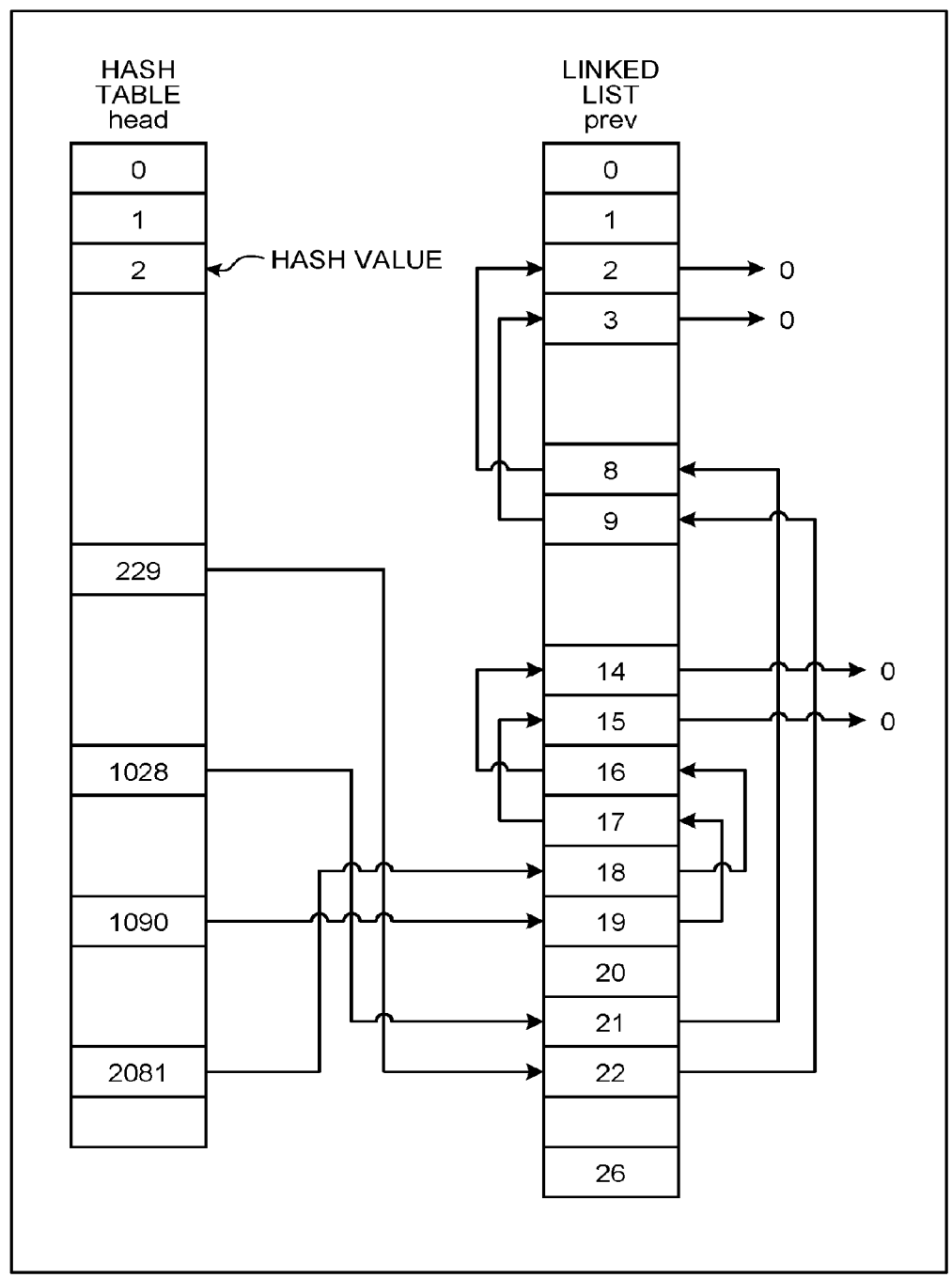
FIG. 1 is a diagram illustrating a reference example of the structures of a hash table and a linked list.
Figure 2B:
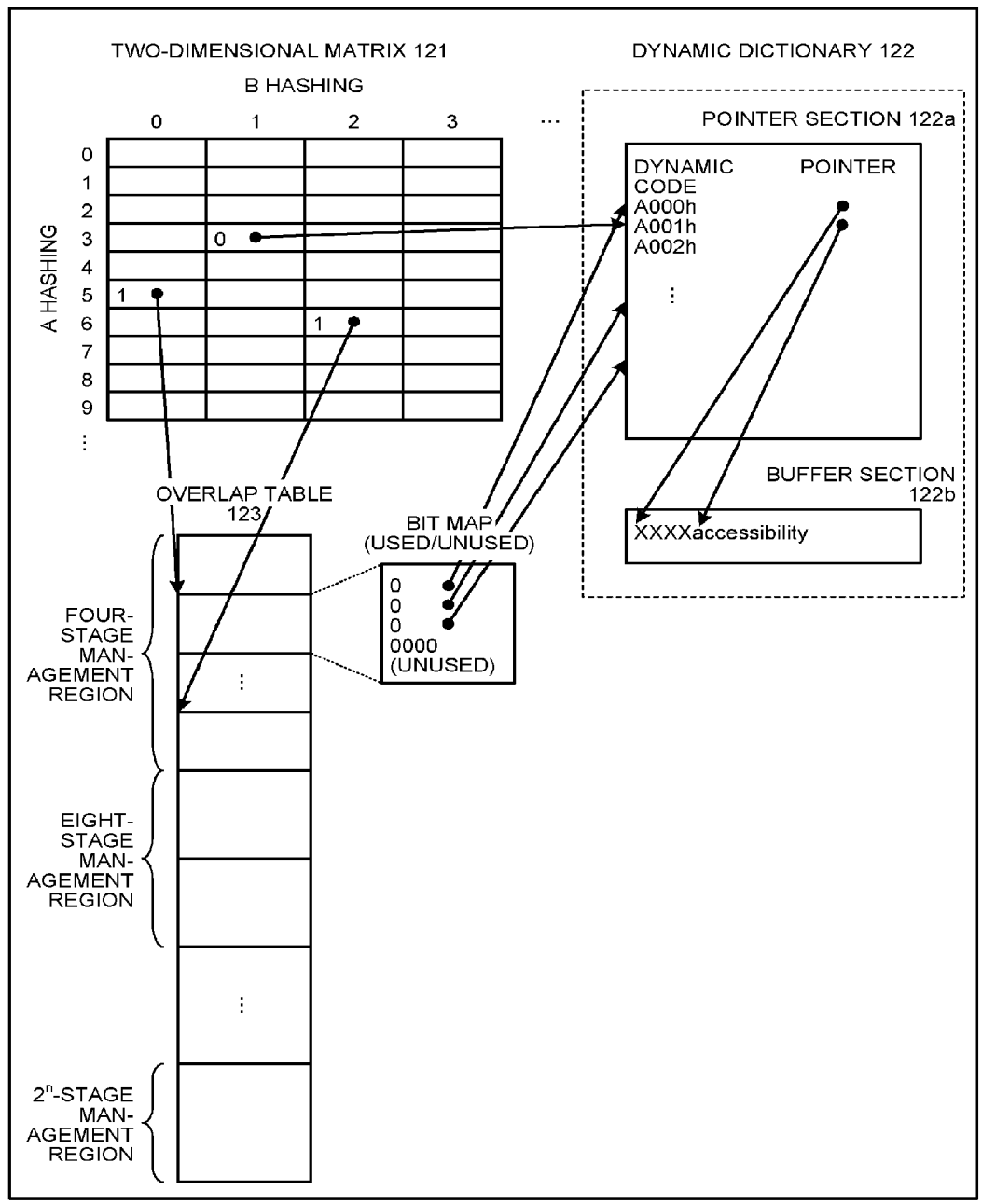
FIG. 2B is another diagram illustrating the example of the procedure of an encoding process according to the embodiment.
Figure 2C:
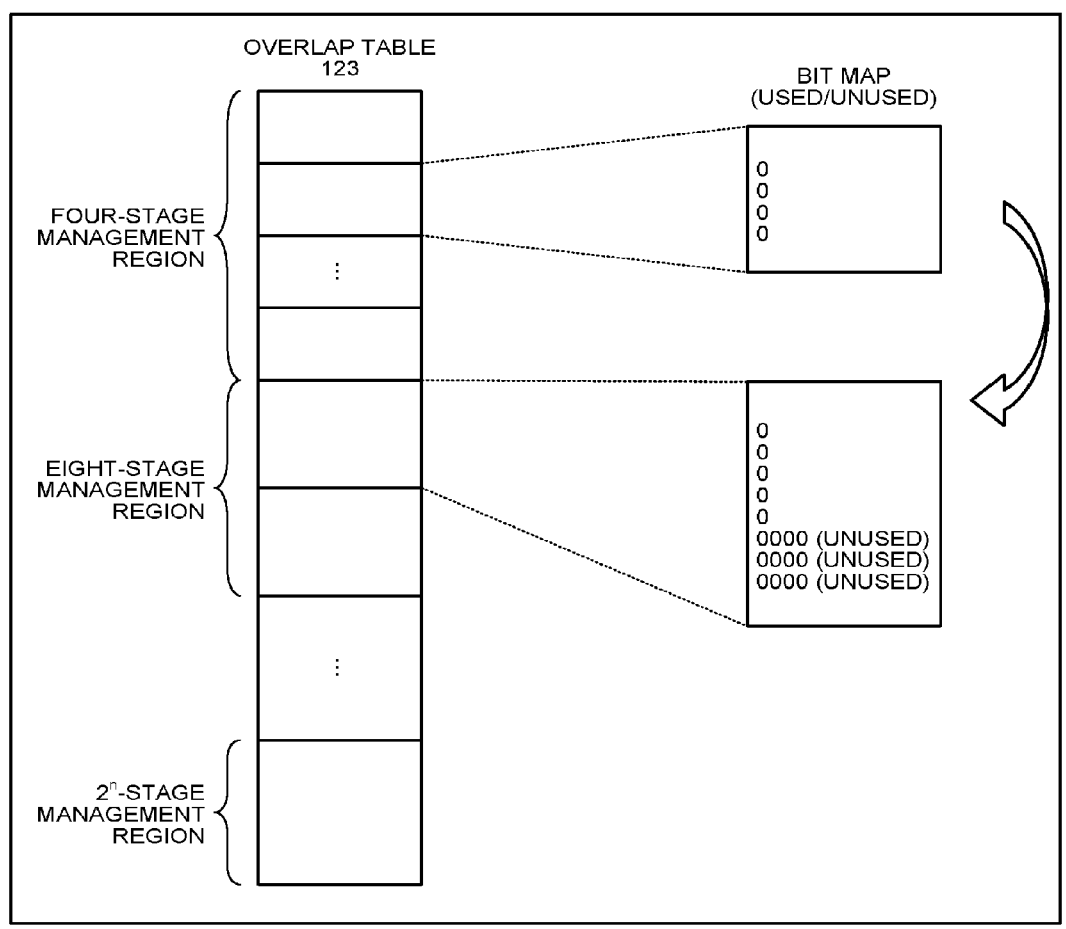
FIG. 2C is still another diagram illustrating the example of the procedure of the encoding process according to the embodiment.

FIGS. 2A to 2C are diagrams illustrating an example of procedures of the encoding process according to the embodiment.

At the start, an encoding apparatus 100 assigns a four-bit header and a 20-bit integer to each word and registers the word as the 3-byte fundamental word code in a static dictionary. For example, F003BEh is assigned to a word "accessibility". While a static code of a variable length is assigned to a word that appears at a high frequency, depending on the frequency, a dynamic code of 2 to 3 bytes is assigned to a word that appears at a low frequency, in accordance with the order of appearance.

Here, the relation between words in an English-Japanese Dictionary and 20-bit integers is described. Kenkyusha's English-Japanese Dictionary for the General Reader contains approximately 270,000 words. Oxford Advanced Learner's Dictionary contains approximately 500,000 words. Both of these dictionaries contain less than 1,000,000 words. On the other hand, 20 bits corresponds to 1 megabyte (MB) at the maximum, and can express 1,000,000 words. That is, words in each of these dictionaries can be identified with 20-bit integers.

In addition, as illustrated in FIG. 2A, the encoding apparatus 100 assigns codes to words by using a two-dimensional hash matrix. For example, the encoding apparatus 100 A-hashes and B-hashes a word "accessibility (6163636573736962696C697479h)". A-hashing herein means calculating a remainder of a word divided by a certain prime number A. B-hashing herein means calculating a remainder of a piece of hashed data divided by a prime number B that is different from the prime number A used in A-hashing. In one example, the number of words to be encoded is 10,000, prime numbers used in A-hashing and B-hashing are selected so that the number of two-dimensional matrix elements expressed by a remainder calculated in the A-hashing and a remainder calculated in the B-hashing can be approximately 10,000. The prime numbers selected in one example are 97 and 101 when the number of matrices is 10,000. That is, the assumption is present that a combination of remainders obtained by A-hashing and B-hashing a certain word and a combination obtained by A-hashing and B-hashing another word do not collide (overlap) with each other in a two-dimensional matrix space in which the least common multiple is approximately 10,000. 97, which is one of the prime numbers selected, is used in A-hashing in one example, in which a value calculated in the A-hashing is a value in the range of 0 to 96. 101, which is the other prime number selected, is used in B-hashing in one example, in which a value calculated in the B-hashing is a value in the range of 0 to 100. Note that a two-dimensional hash matrix, which can be expressed by remainders calculated in A-hashing and remainders calculated in B-hashing is referred to as a "two-dimensional matrix" hereinafter. Also note that names given to A-hashing (A-hash) and B-hashing (B-hash) are not limited to these examples and may be any names that allows two types of hashing to be distinguished from each other.

The encoding apparatus 100 finds an element (position) in a two-dimensional matrix 121 using a combination of remainders obtained by two-dimensional hashing. Pointer information is stored in the position thus found. Here, there are the following two kinds of pointer information. A first kind of pointer information is the pointer information that is stored when a combination of remainders does not overlap with another. That is, this kind is stored when a combination of remainders does not collide with another. Pointer information p1 in this case contains an identification flag "0" and a pointer (hereinafter a word pointing pointer), indicating a dynamic code, that points a word. A second kind of pointer information is the pointer information that is applied when a combination of remainders overlaps with another. That is, this kind is applied when a combination of remainders collides with another. The pointer information p2 in this case contains an identification flag "1" and a pointer (hereinafter, an overlap table (123) pointing pointer) to an overlap table 123. The overlap table 123 is a table used for, when a combination of remainders obtained by two-dimensional hashing collides with another, managing word pointing pointers indicating dynamic codes with respect to a plurality of words corresponding to these overlapping combinations of remainders. Note that a detailed description of the overlap table 123 is given later.

As illustrated in FIG. 2B, the encoding apparatus 100 determines, using the pointer information in the position found, whether a word to be encoded has been registered in a dynamic dictionary 122.

Here, firstly, a static dictionary means a dictionary obtained by determining, based on materials such as a general English dictionary, Japanese dictionary, and textbook, the appearance frequencies of words that appear in a document and, and then assigning shorter codes to words that have higher appearance frequencies. In contrast, the dynamic dictionary 122 means a dictionary in which words not registered in the static dictionary are associated with codes dynamically assigned. Words not registered in the static dictionary include, in one example, words having low appearance frequency (low-frequency words), unknown words, numerical values, clock times, and tags. An unknown word herein means a word that has not been registered in the static dictionary and that is characterized by repeatedly appearing in a document to be encoded. In a buffer section of the dynamic dictionary 122, words associated with dynamic codes have been registered in accordance with order of appearance of words not registered in the static dictionary.

For example, when the identification flag of the pointer information in the position found is "0", the encoding apparatus 100 tracks a word pointing pointer contained in the pointer information and determines whether a word to be encoded has been registered in the dynamic dictionary 122. When the word to be encoded has been registered in the dynamic dictionary 122, the encoding apparatus 100 encodes the word into a dynamic code corresponding to the word thus registered. In this manner, the encoding apparatus 100 can encode a word to be encoded without sequentially scanning a linked list and at high speed, even in the case of encoding in one pass.

When the word to be encoded has not been registered in the dynamic dictionary 122, the encoding apparatus 100 registers the word in the dynamic dictionary 122 and encodes, based on the dynamic dictionary 122, the word into a dynamic code corresponding to the word thus registered. This case is a case where there is an overlap on the found position. In this case, the encoding apparatus 100 reregisters pointer information in the found position in the two-dimensional matrix 121. The pointer information contains an identification flag "1" and the overlap table 123 pointing pointer. The encoding apparatus 100 places, in an unused position in a management region indicated by the overlap table 123 pointing pointer, ON indicating that the position is currently used and a word pointing pointer indicating a dynamic code. Here, ON and word pointing pointers are placed for two words overlapping with each other on the found position.

When the identification flag of the pointer information in the position found is "1", the encoding apparatus 100 tracks the overlap table (123) pointing pointer contained in the pointer information, searches a management region indicated by the pointer thus tracked, and determines whether a word to be encoded has been registered in the dynamic dictionary 122. When the word to be encoded has been registered in the dynamic dictionary 122, the encoding apparatus 100 encodes the word into a dynamic code corresponding to the word thus registered.

When the word to be encoded has not been registered in the dynamic dictionary 122, the encoding apparatus 100 registers the word in the dynamic dictionary 122 and encodes, based on the dynamic dictionary 122, the word into a dynamic code corresponding to the word thus registered. This case is a case where there is a further overlap on the found position. In this case, the encoding apparatus 100 places "0" and a word pointing pointer in an unused position in a management region indicated by the overlap table 123 pointing pointer. "0" (equivalent to ON hereinafter) indicates that the position is currently used. The word pointing pointer indicates a dynamic code.

Here, the overlap table 123 includes a four-stage management region, a eight-stage management region, and a $2^n$-stage management region (n is an integer of at least 4). Each of the management regions is assigned to a certain position in the two-dimensional matrix 121 when there is an overlap on the position. A four-stage management region is a region for managing information on registration of up to four words when there is an overlap on the same position, and a plurality of management regions for four stages are secured. An eight-stage management region is a region for managing information on registration of up to eight words when there is an overlap on the same position, and a plurality of management regions for eight stages are secured.

As illustrated in FIG. 2C, when there is an additional overlap on the same position, it is likely that a corresponding word is dropped off because the corresponding four-stage management region is full. That is, this is a case where the management region has no unused position. In this case, the encoding apparatus 100 transfers information placed in the four-stage management region to an eight-stage management region having a larger size than a four-stage management region. The encoding apparatus 100 updates, to "0000" (hereinafter equivalent to OFF) indicating that all of the stages are unused, the management region where the information has been placed before being transferred. The encoding apparatus 100 reregisters, in a corresponding piece of pointer information in the two-dimensional matrix, a pointer to a transfer destination in the overlap table 123. With respect to a word newly found overlapping on the same position, the encoding apparatus 100 then places, in an unused position in the management region that is the transfer destination, ON indicating that the position is currently used and a word pointing pointer indicating a dynamic code. The encoding apparatus 100 encodes the word newly found overlapping on the same position into a dynamic code. In this manner, even when a management region is full, the encoding apparatus 100 can efficiently use the overlap table 123 by changing the size of the management region.

One Example of Dynamic Dictionary

Figure 3:
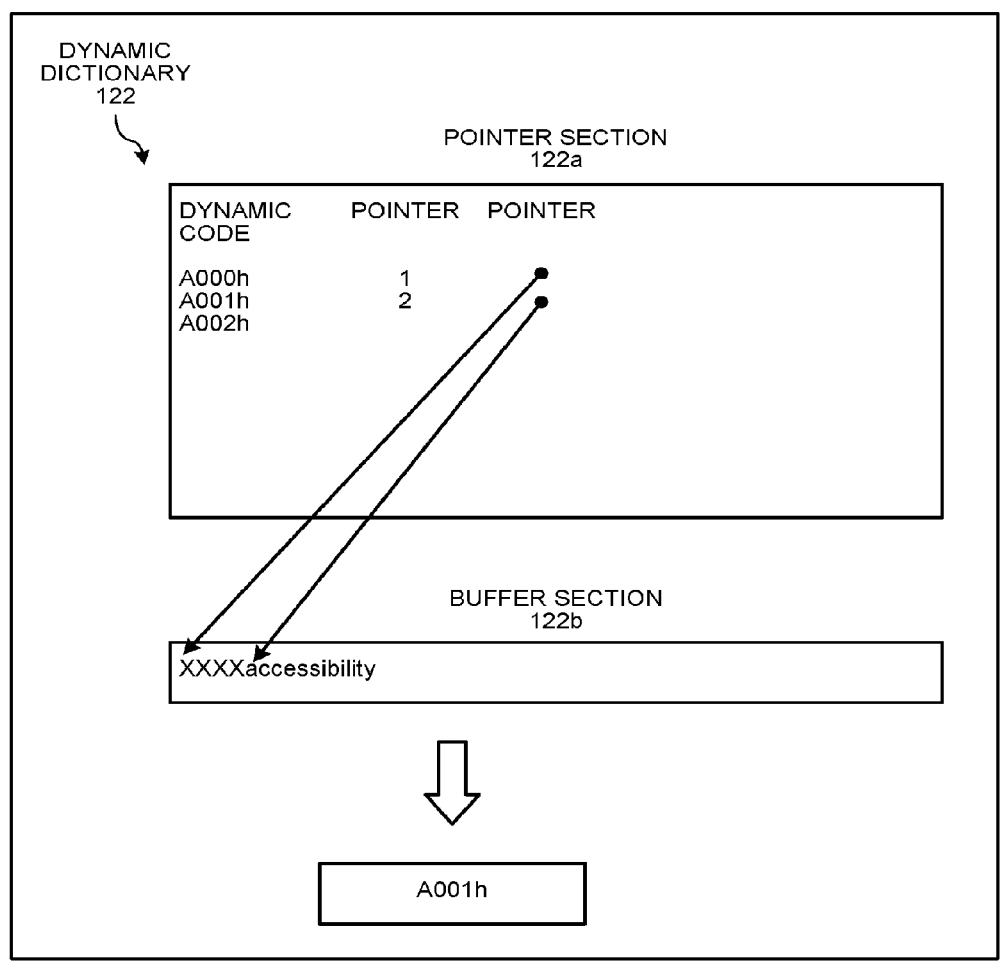
FIG. 3 is a diagram illustrating an example of a dynamic dictionary according to the embodiment.

FIG. 3 is a diagram illustrating an example of a dynamic dictionary according to the embodiment. The dynamic dictionary 122 illustrated in FIG. 3 includes a pointer section 122a and a buffer section 122b. The buffer section 122b stores the respective strings of words. The pointer section 122a retains dynamic codes in association with types and pointers. The dynamic codes are codes having a predetermined fixed length and are codes assigned in accordance with order of registration of words in the buffer section 122b. The types are used for distinction between types of words registered. As the types, for example, "1" is set for low-frequency words, "2" is set for unknown words, "3" is set for numeric values, "4" is set for clock times, and "5" is set for tags. The pointers indicate the beginnings of words stored in the buffer section 122b. Note that each of the pointers may be a set of a storage position and a data length. The storage position indicates a position, from the beginning of the buffer section 122b, at which a word starts, and the data length indicates the length (length in bytes) of the string of a word stored.

In one example, when a word "accessibility" is the word registered in the buffer section 122b, the encoding apparatus 100 registers, as a pointer corresponding to the word "accessibility", a pointer that indicates the beginning of the buffer section 122b. In addition, the encoding apparatus 100 registers "2" (for a unknown word) as the type of the word "accessibility".

As illustrated in FIG. 3, if the word "accessibility" is registered in the dynamic dictionary 122, the dynamic code of the word "accessibility" is set to "A001h". In this case, the encoding apparatus 100 encodes the word "accessibility" into a dynamic code "A001h".

Configuration of Encoding Apparatus

Figure 4:
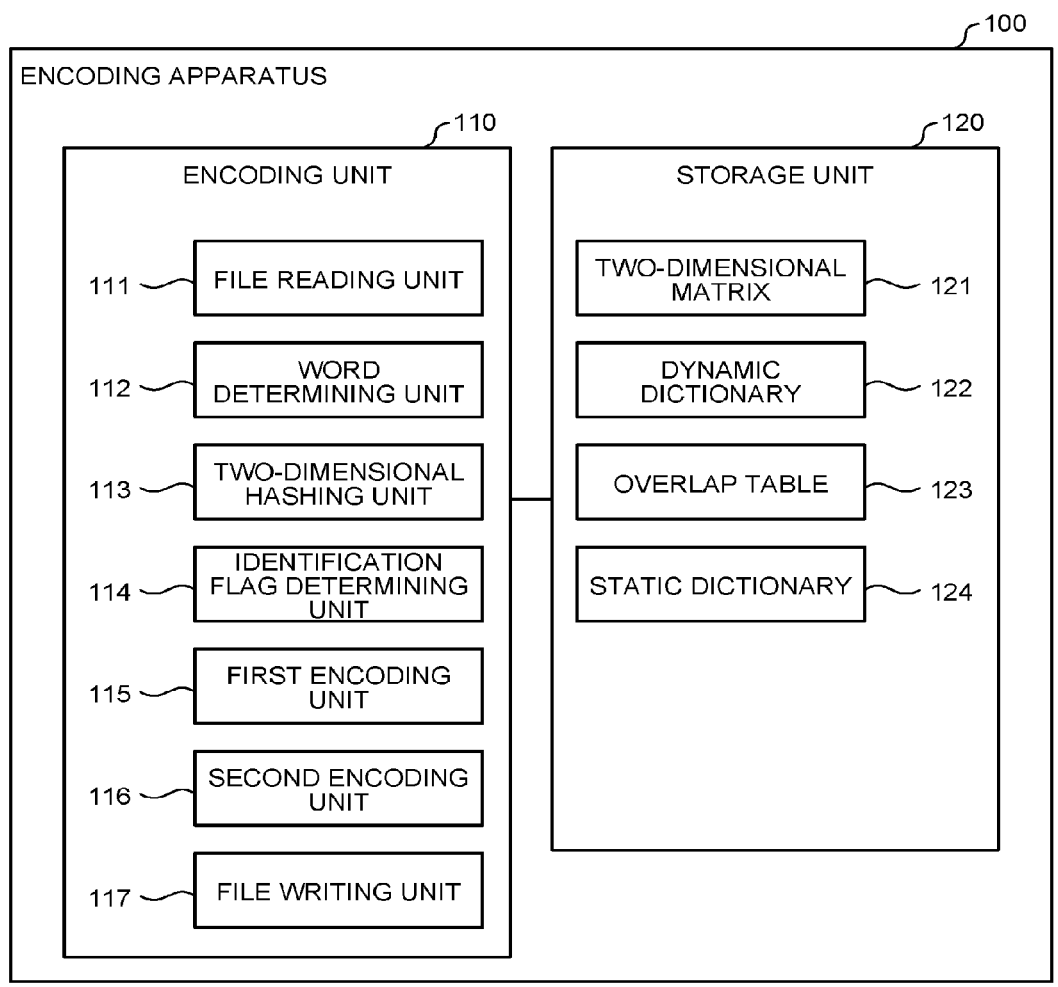
FIG. 4 is a functional block diagram illustrating the configuration of an encoding apparatus according to the embodiment.

FIG. 4 is a functional block diagram illustrating the configuration of an encoding apparatus according to the embodiment. As illustrated in FIG. 4, the encoding apparatus 100 includes an encoding unit 110 and a storage unit 120.

The encoding unit 110 is a processing unit that executes the encoding process illustrated in FIG. 2A to FIG. 2C. The encoding unit 110 includes a file reading unit 111, a word determining unit 112, a two-dimensional hashing unit 113, an identification flag determining unit 114, a first encoding unit 115, a second encoding unit 116, and a file writing unit 117.

The storage unit 120 corresponds to, for example, a storage device such as a non-volatile semiconductor memory device examples of which include a flash memory and a ferroelectric random access memory (FRAM). The storage unit 120 contains the two-dimensional matrix 121, the dynamic dictionary 122, the overlap table 123 and the static dictionary 124.

The two-dimensional matrix 121 is a two-dimensional matrix expressed by remainders calculated in A-hashing and remainders calculated in B-hashing. A two-dimensional matrix herein is one example of first hashed data. Note that the description of the two-dimensional matrix 121 is the same as those given in connection with FIG. 2A and FIG. 2B, and is therefore omitted here.

The dynamic dictionary 122 means a dictionary in which words not registered in the static dictionary 124 are associated with codes dynamically assigned. Note that the description of the dynamic dictionary 122 is the same as that given in connection with FIG. 3, and is therefore omitted here.

The overlap table 123 is used for, when a combination of remainders obtained by two-dimensional hashing collides with another, managing pointers to words indicating dynamic codes with respect to a plurality of words corresponding to these overlapping combinations of remainders. Note that the description of the overlap table 123 is the same as those given in connection with FIG. 2B and FIG. 2C, and is therefore omitted here.

Figure 5:
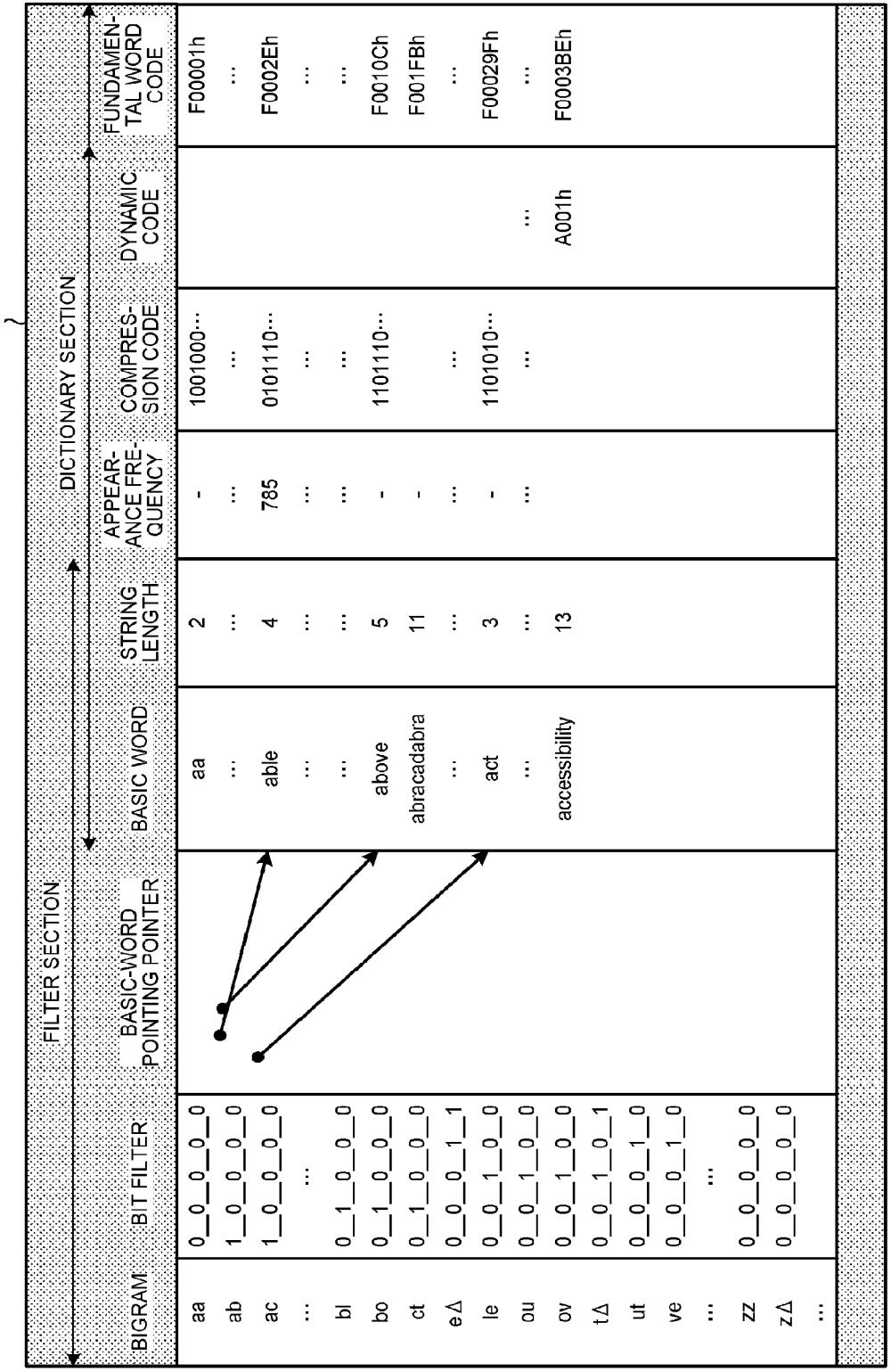
FIG. 5 is a diagram illustrating an example of a static dictionary.

The static dictionary 124 is a dictionary obtained by determining, based on materials such as a general English dictionary, Japanese dictionary, and textbook, the appearance frequencies of words that appear in a document and, and then assigning shorter codes to words that have higher appearance frequencies. Here, an example of the static dictionary 124 is described with reference to FIG. 5. FIG. 5 is a diagram illustrating an example of a static dictionary.

As illustrated in FIG. 5, the static dictionary 124 associates a basic word, a string length, an appearance frequency, a compression code, a dynamic code, and a fundamental word code with one another. A "basic word" is a word registered in the static dictionary 124. For example, a "basic word" is one of approximately 190,000 words previously extracted from materials such as a dictionary and a group of text. Note that the number of words that are registered as "basic words" may be any number of words. A three-byte "fundamental word code" is assigned to and registered for each of the words.

A "string length" is the length of the string of each basic word. An "appearance frequency" is the number of times each basic word appears in a group of text files used for counting frequencies. A group of text files used for counting frequencies herein is one or more text files previously prepared from which the appearance frequency of each basic word is counted.

A description is given of counting of the appearance frequency of a basic word. The encoding apparatus 100 reads in text files used for counting frequencies, extracts words present in the group of text files used for counting frequencies as appropriate, and registers the words in the static dictionary 124. Furthermore, the encoding apparatus 100 counts, as the appearance frequency of each basic word registered in the static dictionary 124, the number of times it appears in the group of text files used for counting frequencies. For example, in the example in FIG. 5, the static dictionary 124 indicates that a basic word "able" appears 785 times in the group of text files used for counting frequencies.

An "compression code" and a "dynamic code" are compression codes that are both assigned to each basic word. The encoding apparatus 100 assigns, to words that appear at high frequencies, variable-length compression codes according to the respective frequencies. On the other hand, the encoding apparatus 100 assigns, to words that appear at low frequencies, dynamic codes of 2 to 3 bytes in accordance with order of appearance of the words.

Note that the static dictionary 124 may be linked with a filter section, as illustrated in FIG. 5. The filter section is a filter that determines whether a word to be encoded has been registered in the static dictionary 124. The filter section contains bigrams and bit filters. A "bigram" refers to two consecutive characters contained in each word. For example, "able" has bigrams corresponding to "ab", "bl", and "le". A "bit filter" means a bit filter corresponding to bigram string. For example, "able" is associated with a bit filter "1_0_0_0_0" for a bigram "ab", a bit filter "0_1_0_0_0" for a bigram "bl", and a bit filter "0_0_1_0_0" for a bigram "le" via pointers to basic words. For example, upon acquiring a word "able" to be encoded, the encoding apparatus 100 accesses a basic word "able" by using the bit filter "1_0_0_0_0" for the bigram "ab", the bit filter "0_1_0_0_0" for the bigram "bl", and the bit filter "0_0_1_0_0" for the bigram "le". In addition, the static dictionary 124 can be also associated with a two-dimensional matrix.

The file reading unit 111 reads out data from a content part of a file to be encoded. The file reading unit 111 scans strings contained in the readout data from the beginning of the data, sequentially extracts words each having a termination symbol as a delimiter between itself and the next word, and sequentially outputs the extracted words to the word determining unit 112.

The word determining unit 112 determines whether a word to be encoded has been registered in the static dictionary 124. For example, the word determining unit 112 determines whether the static dictionary 124 contains any basic word that matches the word. Upon determining that the static dictionary 124 does not contain any basic word that matches the word, the word determining unit 112 outputs the word to the two-dimensional hashing unit 113. Note that, upon determining that the static dictionary 124 contains some basic word that matches the word, the word determining unit 112 encodes the word into a word code corresponding to the contained basic word.

The two-dimensional hashing unit 113 two-dimensionally hashes a word to be encoded.

For example, the two-dimensional hashing unit 113 A-hashes a word to be encoded and B-hashes the word at one time. Specifically, to A-hash a word is defined herein as to calculate the remainder of the word divided by a prime number 97. To B-hash a word is defined herein as to calculate the remainder of the word divided by a prime number 101. It is assumed here that the word is "8657" (a decimal). In this case, the two-dimensional hashing unit 113 A-hashes 8657, or calculates the remainder 24 of 8657 divided by the prime number 97. In this case, the two-dimensional hashing unit 113 B-hashes 8657, or calculates the remainder 41 of 8657 divided by the prime number 101.

Furthermore, the two-dimensional hashing unit 113 finds a matrix element (position) in the two-dimensional matrix 121 that corresponds to a combination of the remainder calculated by the A-hashing and the remainder calculated by the B-hashing. The two-dimensional hashing unit 113 outputs, to the identification flag determining unit 114, pointer information placed in the found matrix element (position). Specifically, the two-dimensional hashing unit 113 finds a position in the two-dimensional matrix 121 that corresponds to (24, 41), and outputs pointer information placed in this position to the identification flag determining unit 114.

The identification flag determining unit 114 determines what an identification flag in the pointer information indicates. For example, the identification flag determining unit 114 determines whether the identification flag in the pointer information is "0" indicating that the combination of the remainders does not overlap with another. Upon determining that the identification flag in the pointer information is "0" indicating that the combination of the remainders does not overlap with another, the identification flag determining unit 114 outputs the word to be encoded and the pointer information to the first encoding unit 115. Upon determining that the identification flag in the pointer information is not "0" indicating that the combination of the remainders does not overlap with another, the identification flag determining unit 114 outputs the word to be encoded and the pointer information to the second encoding unit 116.

The first encoding unit 115 encodes a word to be encoded by using a word pointing pointer contained in pointer information.

For example, the first encoding unit 115 tracks the word pointing pointer contained in the pointer information and determines whether the word to be encoded has been registered in the dynamic dictionary 122. Upon determining that the word to be encoded has been registered in the dynamic dictionary 122, the first encoding unit 115 encodes the word into a dynamic code corresponding to the registered word.

A case where the dynamic dictionary 122 is as illustrated in FIG. 3 is described as an example. It is assumed here that the word to be encoded is "accessibility". In this case, the first encoding unit 115 tracks the word pointing pointer contained in the pointer information and determines whether the word to be encoded "accessibility" is identical to a word indicated by the pointer section 122a in the dynamic dictionary 122. Here, these words are identical to each other, and the first encoding unit 115 hence determines that the word to be encoded "accessibility" has already been registered in the dynamic dictionary 122. The first encoding unit 115 encodes the word to be encoded "accessibility" into a dynamic code "A001h" corresponding to the word already registered.

On the other hand, upon determining that the word to be encoded has not yet been registered in the dynamic dictionary 122, the first encoding unit 115 registers the word in the dynamic dictionary 122. Based on the dynamic dictionary 122, the first encoding unit 115 encodes the word into a dynamic code corresponding to the word thus registered. The first encoding unit 115 reregisters pointer information that contains an identification flag "1" for the pointer information and an overlap table 123 pointing pointer. The first encoding unit 115 places, in an unused position in a management region indicated by the overlap table 123 pointing pointer, ON indicating that the position is currently used and a word pointing pointer indicating a dynamic code placed in pointer information before the reregistration. The first encoding unit 115 places, in an unused position in the same management region, ON indicating that the position is currently used and a word pointing pointer to a word registered this time.

A case where the dynamic dictionary 122 is as illustrated in FIG. 2B is described as an example. It is assumed here that a word to be encoded is "YYYY". It is also assumed that the remainders obtained by A-hashing and B-hashing the word to be encoded are 3 and 1, respectively. In this case, the first encoding unit 115 tracks the word pointing pointer contained in the pointer information in a matrix element corresponding to a combination of remainders (3, 1), and determines whether the word to be encoded "YYYY" is identical to a word that is indicated by a pointer in the pointer section 122a in the dynamic dictionary 122. Here, the word to be encoded "YYYY" is not identical to a word "accessibility" that is indicated by the pointer in the pointer section 122a, and the first encoding unit 115 hence determines that the word to be encoded "YYYY" has not been registered in the dynamic dictionary 122. The first encoding unit 115 registers the word to be encoded "YYYY" in the buffer section 122b. Based on the dynamic dictionary 122, the first encoding unit 115 encodes the word "YYYY" into an unused dynamic code "A002h". The first encoding unit 115 reregisters pointer information that contains an identification flag "1" from the pointer information in a matrix element corresponding to the combination of remainders (3, 1) and an overlap table 123 pointing pointer. The first encoding unit 115 then places ON and a word pointing pointer in an unused position in a management region indicated by the overlap table 123 pointing pointer. ON indicates that the position is currently used. The word pointing pointer indicates a dynamic code ("A001h") placed in the pointer information before the reregistration. The first encoding unit 115 places, in an unused position in the same management region, ON indicating that the position is currently used and a word pointing pointer indicating the dynamic code ""A002h" registered in the dynamic dictionary 122 this time.

Note that, when a word pointing pointer in pointer information is at an initial value, a word to be encoded has not been registered in the dynamic dictionary 122, and the first encoding unit 115 hence registers the word in the dynamic dictionary 122. Based on the dynamic dictionary 122, the first encoding unit 115 encodes the word into a dynamic code corresponding to the word thus registered. The first encoding unit 115 registers pointer information that contains an identification flag "1" and a word pointing pointer registered in the dynamic dictionary 122.

The second encoding unit 116 encodes a word to be encoded by using an overlap table 123 pointing pointer contained in pointer information.

For example, the second encoding unit 116 tracks the overlap table 123 pointing pointer contained in the pointer information, and determines, by using a management region indicated by the pointer as a search area, whether a word to be encoded has already been registered in the dynamic dictionary 122. Upon determining that the word to be encoded has been registered in the dynamic dictionary 122, the second encoding unit 116 encodes the word into a dynamic code corresponding to the already registered word.

A case where the dynamic dictionary 122 is as illustrated in FIG. 2B is described as an example. It is assumed here that a word to be encoded is "XXXX". It is also assumed that the remainders obtained by A-hashing and B-hashing the word to be encoded are 5 and 0, respectively. In this case, the second encoding unit 116 tracks an overlap table 123 pointing pointer contained in the pointer information in a matrix element corresponding to a combination of remainders (5, 0), and determines whether the word to be encoded "XXXX" is identical to a word that is indicated by the pointer in the pointer section 122a in the dynamic dictionary 122. Here, these words are identical to each other in the first stage in a management region indicated by the pointer, and the second encoding unit 116 hence determines that the word to be encoded "XXXX" has already been registered in the dynamic dictionary 122. The second encoding unit 116 encodes the word to be encoded "XXXX", into a dynamic code "A000h" corresponding to the word already registered.

On the other hand, upon determining that the word to be encoded has not yet been registered in the dynamic dictionary 122, the second encoding unit 116 registers the word in the dynamic dictionary 122. Based on the dynamic dictionary 122, the second encoding unit 116 encodes the word into a dynamic code corresponding to the word thus registered. The second encoding unit 116 places, in an unused position in a management region indicated by the overlap table 123 pointing pointer, ON indicating that the position is currently used and a word pointing pointer indicating the word registered this time.

A case where the dynamic dictionary 122 is as illustrated in FIG. 2B is described as an example. It is assumed here that a word to be encoded is "AAAA". It is also assumed that the remainders obtained by A-hashing and B-hashing the word to be encoded are 5 and 0, respectively. In this case, the second encoding unit 116 tracks an overlap table 123 pointing pointer contained in the pointer information in a matrix element corresponding to a combination of remainders (5, 0), and determines whether the word to be encoded "AAAA" is identical to a word that is indicated by the pointer in the pointer section 122a in the dynamic dictionary 122. Here, the word to be encoded "AAAA" is not identical to any of words indicated by pointers in the pointer section 122a, and the second encoding unit 116 hence determines that the word to be encoded "AAAA" has not yet been registered in the dynamic dictionary 122. The second encoding unit 116 registers the word to be encoded "AAAA" in the buffer section 122b. Based on the dynamic dictionary 122, the second encoding unit 116 encodes the word "AAAA" into an unused dynamic code "A002h". The second encoding unit 116 then places, in an unused position in a management region indicated by the overlap table 123 pointing pointer, ON indicating that the position is currently used and a word pointing pointer indicating the dynamic code "A002h" registered in the dynamic dictionary 122 this time.

Note that, when there is no unused position in a management region indicated by an overlap table 123 pointing pointer, the second encoding unit 116 may determine that the management region is full and transfer information already set in the management region to another management region having a larger size than the current management region. The second encoding unit 116 then replaces the pointer in the pointer information with an overlap table 123 pointing pointer that points the new management region to which the information has been transferred. The second encoding unit 116 then reregisters the pointer information.

The file writing unit 117 acquires encoded data from the first encoding unit 115 and the second encoding unit 116 and writes the acquired encoded data into an encoded file.

Flowchart for Encoding Process

Figure 6A:
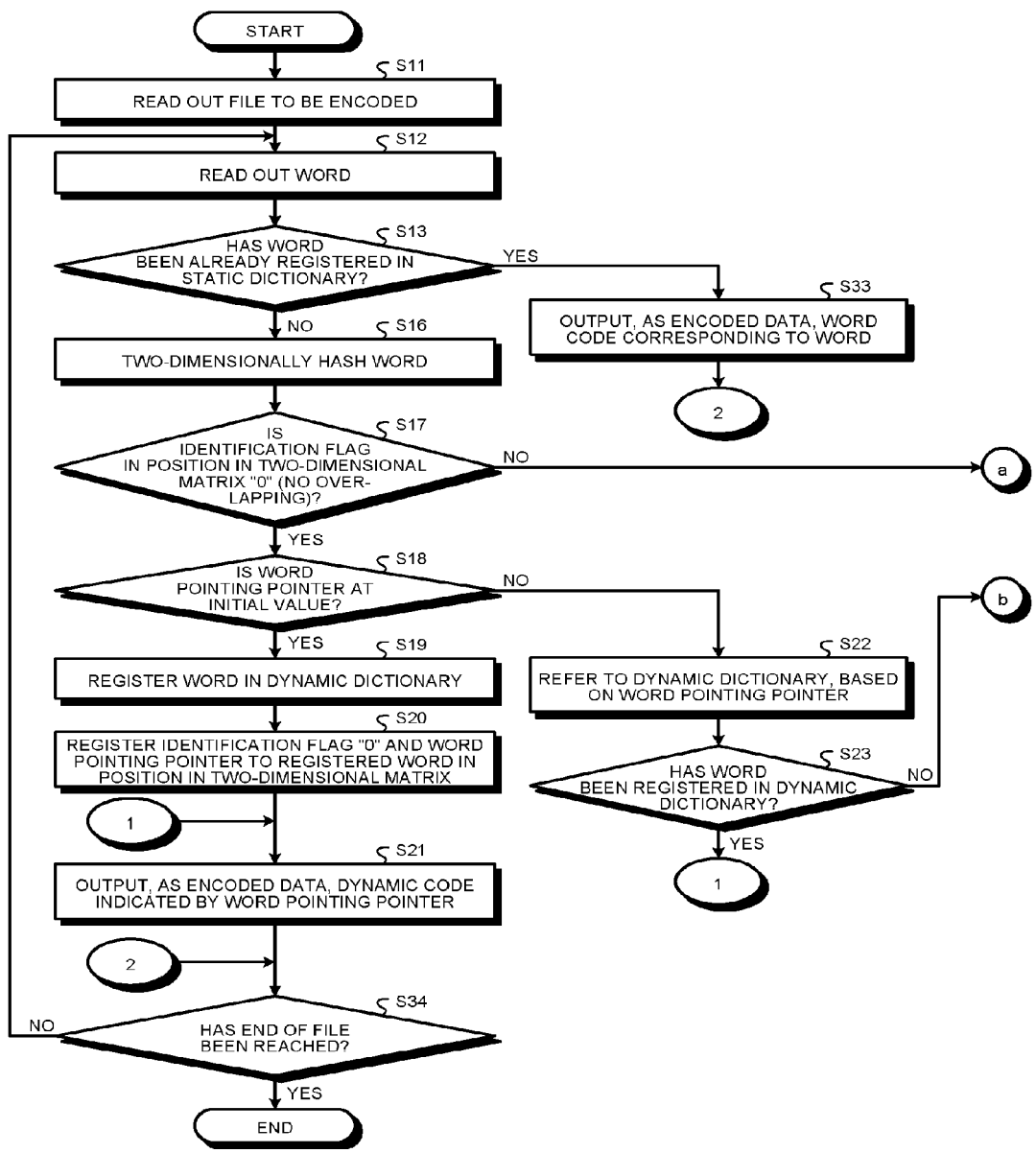
FIG. 6A is a first diagram illustrating an example of a flowchart for the encoding process according to the embodiment.
Figure 6B:
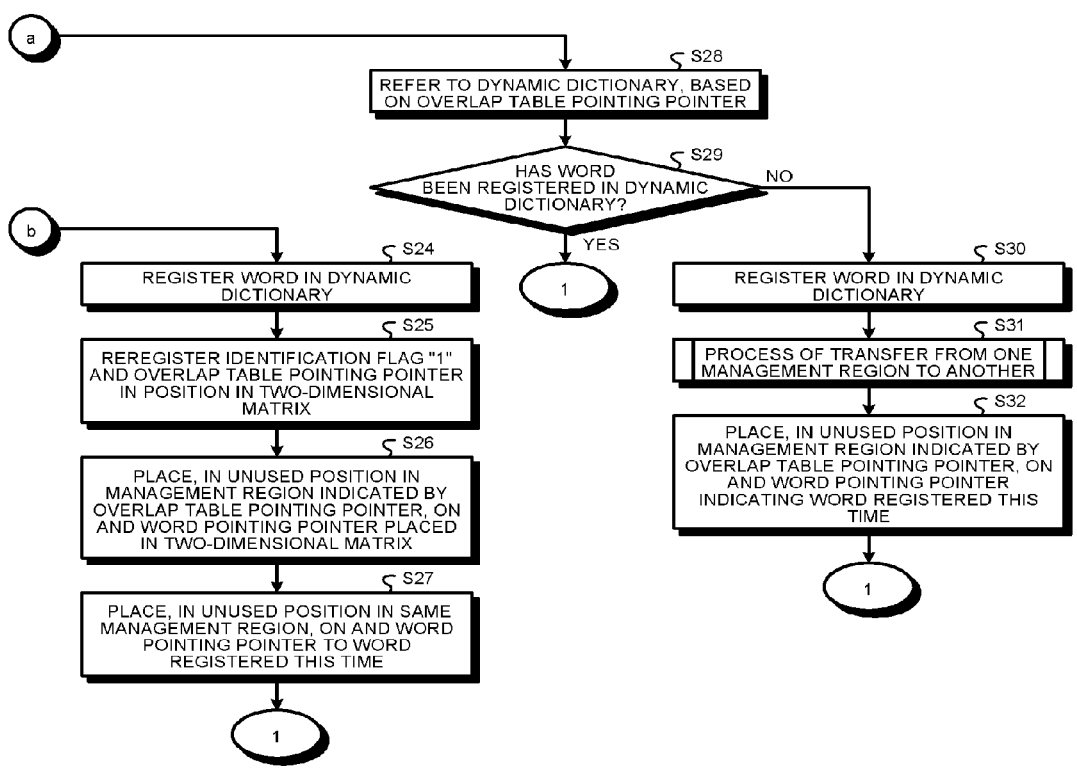
FIG. 6B is a second diagram illustrating the example of the flowchart for the encoding process according to the embodiment.

FIG. 6A and FIG. 6B are diagrams illustrating an example of a flowchart for the encoding process according to the embodiment.

At the start, the encoding apparatus 100 reads out a file to be encoded (step S11). The encoding apparatus 100 reads out words from the readout file (step S12). For example, the encoding apparatus 100 scans strings contained in the file and reads out words each having a termination symbol as a delimiter between itself and the next word.

Subsequently, the encoding apparatus 100 determines whether each of the read-out words has already been registered in the static dictionary 124 (step S13). For example, the encoding apparatus 100 determines whether the static dictionary 124 contains any basic word that is identical to the read-out word.

If determining that the read-out word has not yet been registered in the static dictionary 124 (No at step S13), the encoding apparatus 100 two-dimensionally hashes the read-out word (step S16). For example, the encoding apparatus 100 A-hashes the read-out word and B-hashes the read-out word.

Subsequently, the encoding apparatus 100 finds a matrix element (a position) in the two-dimensional matrix 121 with respect to a combination obtained by the two-dimensional hashing. The encoding apparatus 100 then determines whether the identification flag in pointer information placed in the position thus found is "0" (indicating no overlapping) (step S17). If determining that the identification flag in the pointer information is "0" (Yes at step S17), the encoding apparatus 100 determines whether a word pointing pointer in the pointer information is at an initial value (step S18).

If determining that the word pointing pointer in the pointer information is at an initial value (Yes at step S18), the encoding apparatus 100 determines that the read-out word has not yet been registered in the dynamic dictionary 122, and registers the word in the dynamic dictionary 122 (step S19). Then, the encoding apparatus 100 registers, in the position in the two-dimensional matrix 121, pointer information that contains an identification flag "0" and a word pointing pointer to the word registered in the dynamic dictionary 122 (step S20). The encoding apparatus 100 then outputs, as encoded data, a dynamic code indicated by the word pointing pointer (step S21).

On the other hand, if determining that the word pointing pointer in the pointer information is not the initial value (No at step S18), the encoding apparatus 100 refers to the dynamic dictionary 122 on the basis of the word pointing pointer (step S22). The encoding apparatus 100 then determines whether the read-out word has already been registered in the dynamic dictionary 122 (step S23). If determining that the read-out word has already been registered in the dynamic dictionary 122 (Yes at step S23), the encoding apparatus 100 proceeds to step S21 to encode the read-out word.

On the other hand, if determining that the read-out word has not yet been registered in the dynamic dictionary 122 (No at step S23), the encoding apparatus 100 registers the word in the dynamic dictionary 122 (step S24). The encoding apparatus 100 then reregisters, in the position in the two-dimensional matrix 121, pointer information containing an identification flag "1" and an overlap table 123 pointing pointer (step S25). The encoding apparatus 100 then places, in an unused position in a management region indicated by the overlap table 123 pointing pointer, ON and a word pointing pointer placed in the pointer information before the reregistration in two-dimensional matrix (step S26). The encoding apparatus 100 places, in an unused position in the same management region, ON and a word pointing pointer to a word registered in the dynamic dictionary 122 this time (step S27). The encoding apparatus 100 then proceeds to step S21 to encode the read-out word.

If determining, at step S17, that the identification flag in the pointer information is not "0" (no overlapping) (No at step S17), the encoding apparatus 100 refers to the dynamic dictionary 122 on the basis of a management region indicated by an overlap table 123 pointing pointer (step S28). The encoding apparatus 100 then determines whether the read-out word has already been registered in the dynamic dictionary 122 (step S29). If determining that the read-out word has already been registered in the dynamic dictionary 122 (Yes at step S29), the encoding apparatus 100 proceeds to step S21 to encode the read-out word.

On the other hand, if determining that the read-out word has not yet been registered in the dynamic dictionary 122 (No at step S29), the encoding apparatus 100 registers the word in the dynamic dictionary 122 (step S30). The encoding apparatus 100 then executes a process of transfer from one management region to another (step S31). A flowchart for the process of transfer from one management region to another is described later.

After executing the process of transfer from one management region to another, the encoding apparatus 100 places, in an unused position in a management region indicated by an overlap table 123 pointing pointer, ON and a word pointing pointer indicating the word registered in the dynamic dictionary 122 this time (step S32). The encoding apparatus 100 then proceeds to step S21 to encode the read-out word.

The encoding apparatus 100 then determines whether the end of the file to be encoded has been reached (step S34). If determining that the end of the file to be encoded has not been reached yet (No at step S34), the encoding apparatus 100 proceeds to step S12 to read out the next word.

On the other hand, if determining that the end of the file to be encoded has been reached (Yes at step S34), the encoding apparatus 100 ends the encoding process.

Note that, if determining at step S33 that the read-out word has already been registered in the static dictionary 124 (Yes at step S13), the encoding apparatus 100 outputs, as encoded data, a word code for the word by using the static dictionary 124 (step S33). The encoding apparatus 100 then proceeds to step S34.

FIG. 7 is a diagram illustrating an example of a flowchart for the process of transfer from one management region to another.

Flowchart for Process of Transfer

As illustrated in FIG. 7, the encoding apparatus 100 determines whether a management region indicated by an overlap table 123 pointing pointer has any unused position (step S41).

If determining that the management region has no unused position (No at step S41), the encoding apparatus 100 transfers information placed in the management region indicated by the overlap table 123 pointing pointer to a management region having a larger size than the current management region (step S42). The encoding apparatus 100 then reregisters, in a position in the two-dimensional matrix 121, an overlap table 123 pointing pointer pointing the new management region to which the information has been transferred (step S43). The encoding apparatus 100 then ends the process for transfer from a management region to another.

On the other hand, if determining that the management region has any unused position (Yes at step S41), the encoding apparatus 100 does not need transferring the information from the management region and therefore ends the process for transfer from a management region to another.

Effects of the Embodiment

According to the above embodiment, the encoding apparatus 100 sequentially registers, in the dynamic dictionary 122, strings in the input text data that are not contained in the static dictionary 124. The encoding apparatus 100 adds, to first hashed data obtained by two-dimensionally hashing words contained as registered items in the static dictionary 124, hashed data obtained by hashing strings registered in the dynamic dictionary 122. The encoding apparatus 100 determines, by using the first hashed data, whether each input string has been registered in the static dictionary 124 and whether the string has been registered in the dynamic dictionary 122. In accordance with the result of the determination, the encoding apparatus 100 performs encoding based on a content registered in the static dictionary 124 or the dynamic dictionary 122. This configuration enables, even in the case of encoding in one pass, the encoding apparatus 100 to encode text data to be encoded without sequentially scanning a linked list and at high speed.

According to the embodiment, the encoding apparatus 100 registers the first hashed data in the overlap table 123 when pieces of the first hashed data, which is obtained by two-dimensionally hashing, collide with each other. This configuration enables the encoding apparatus 100 to have the overlap table 123 in a reduced size and to perform faster encoding, by using the overlap table 123 when pieces of the first hashed data collide with each other.

According to the embodiment, when the overlap table 123 is full, the encoding apparatus 100 transfers the already-registered first hashed data to another overlap table 123 that has a larger size than the foregoing overlap table 123. This configuration enables, even when pieces of the first hashed data collide with each other, the encoding apparatus 100 to efficiently use an overlap table 123 by changing the size of the overlap table in accordance with the number of pieces of the first hashed data that have collided with each other.

Furthermore, according to the above embodiment, the encoding apparatus 100 secures, in an overlap table 123, a region to be used for managing data with respect to each piece of the first hashed data. This configuration enables the encoding apparatus 100 to use a linked list with the linked list divided into parts corresponding to different pieces of the first hashed data. The encoding apparatus 100 is thus enabled to search for and encode a desired piece of the first hashed data at high speed.

Other Implementations Relating to the Embodiment

The following describes some modifications in the embodiment described above. Not only the following modifications but also design changes without departing from the gist of the present invention can be implemented as appropriate.

The two-dimensional hashing unit 113 in the encoding apparatus 100 according to the embodiment two-dimensionally hashes hashed data corresponding to a word to be encoded and finds a matrix element (position) in the two-dimensional matrix 121 corresponding to two-dimensional hashing. The foregoing description discloses that the two-dimensional hashing unit 113 outputs, to the identification flag determining unit 114, pointer information placed in the matrix position (element) thus found. However, the two-dimensional hashing unit 113 is not limited to two dimensions and may be adapted to N dimensions. That is, the two-dimensional hashing unit 113 may N-dimensionally hash hashed data corresponding to a word to be encoded and find a matrix element (position) in an N-dimensional matrix corresponding to N-dimensional hashing. The two-dimensional hashing unit 113 may output, to the identification flag determining unit 114, pointer information placed in the matrix position (element) thus found. This configuration enables the encoding apparatus 100 to N-dimensionally hash hashed data and brings the N-dimensional hashing into correspondence with an N-dimensional matrix, thereby being able to associate words to be encoded with the N-dimensional matrix as uniquely as possible. As a result, the encoding apparatus 100 can perform high-speed encoding using the N-dimensional matrix.

In addition, the foregoing description discloses that, in one example, the encoding apparatus 100 according to the embodiment associates the static dictionary 124 with bit filters, and determines, by using the bit filters, whether a word to be encoded has been registered in the static dictionary 124. However, the encoding apparatus 100 is not limited to this example, and may be configured to two-dimensionally hash words registered as registered items in the static dictionary 124. Additionally, the encoding apparatus 100 is configured to previously register pointer information corresponding to the two-dimensional hashing in matrix elements (positions) in the two-dimensional matrix 121. A piece of pointer information in the case of the static dictionary 124 may contain an identification flag "0" (no overlapping) and a word pointing pointer indicating a word code. In this manner, the encoding apparatus 100 can use the two-dimensional matrix 121, instead of bit filters, to determine whether a word to be encoded has been registered in the static dictionary 124. Additionally, the encoding apparatus 100 is configured to, if the word is determined to have been registered, output a word code corresponding to the registered word as encoded data. The encoding apparatus 100 is configured to, if the word is determined not to have been registered, encode the word using the dynamic dictionary 122.

In addition, process procedures, control procedures, specific names, and information including various data and parameters can be optionally changed unless otherwise stated.

Furthermore, through comparison of the dynamic dictionary 122 with an input word, the encoding apparatus 100 according to the embodiment can acquire a dynamic code assigned to the word. In the following descriptions, an apparatus that compares the dynamic dictionary 122 with a word is named a comparison apparatus for the sake of convenience.

Exemplary Configuration of Encoded File

Figure 8:
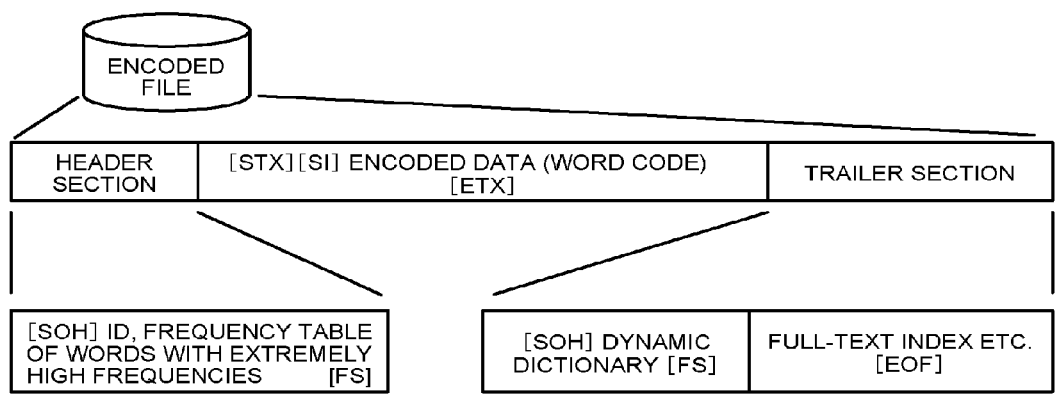
FIG. 8 is a diagram illustrating an exemplary configuration of an encoded file.

First, an exemplary configuration of an encoded file is described with reference to FIG. 8. FIG. 8 is a diagram illustrating an exemplary configuration of an encoded file. As illustrated in FIG. 8, an encoded file contains a header section, encoded data expressed by a plurality of word codes, and a trailer section. In the trailer section, information of the dynamic dictionary 122 is stored. The information of the dynamic dictionary 122 corresponds to the information of the dynamic dictionary that is illustrated in FIG. 3. In the header section, pointers to the information of the dynamic dictionary 122 stored in the trailer section and a frequency table on words of extremely high frequencies are stored. The comparison apparatus to be described later uses the pointers to the dynamic dictionary 122 in the header section to refer to the dynamic dictionary 122 in a comparison process to be described later.

Comparison Process According to Embodiment

Figure 9:
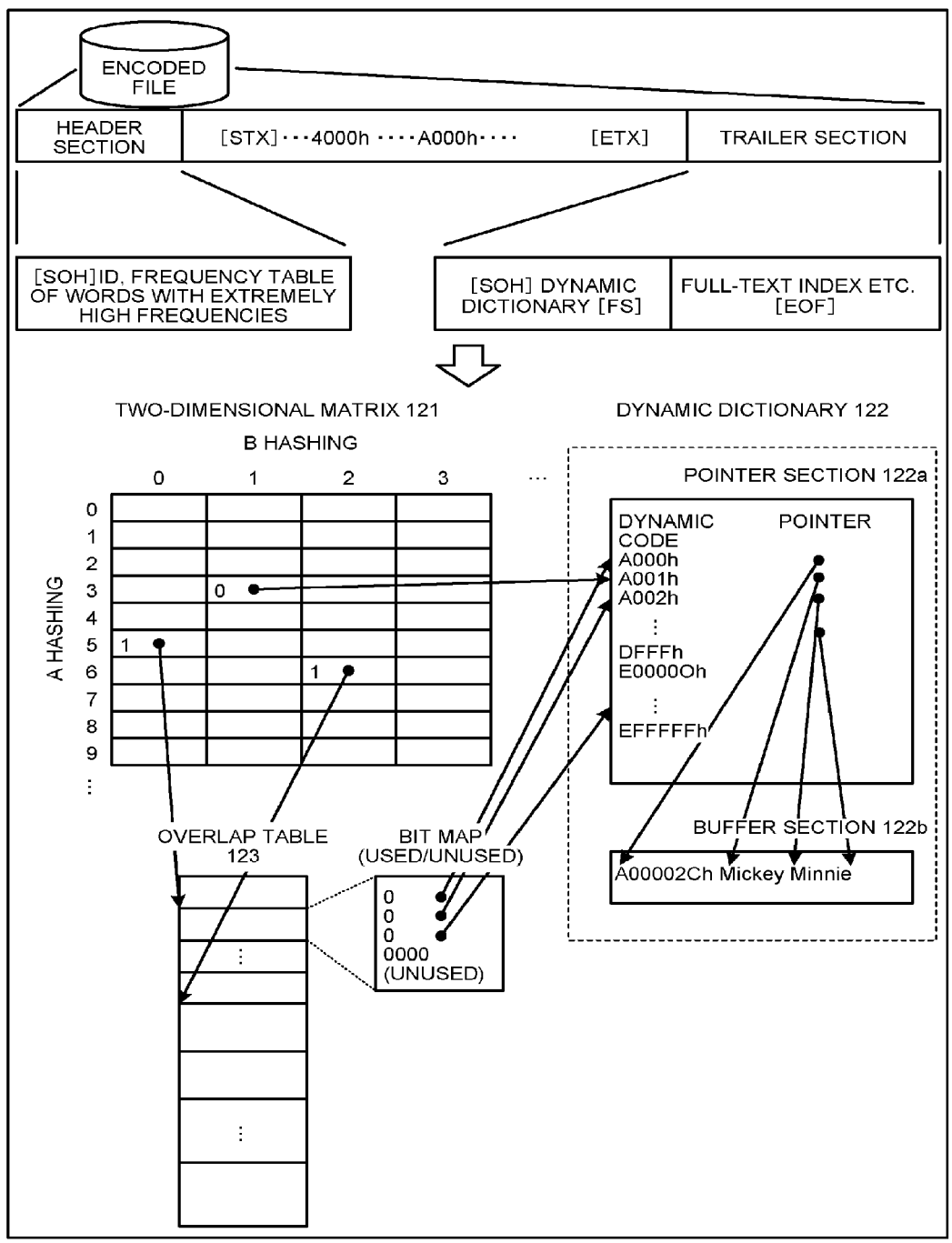
FIG. 9 is a diagram illustrating an example of the procedure of a comparison process according to the embodiment.

FIG. 9 is a diagram illustrating an example of the procedure of the comparison process in the comparison apparatus according to the embodiment. As illustrated in FIG. 9, upon receiving a word subject to comparison, the comparison apparatus reads out an encoded file into a storage area for comparison. The dynamic dictionary 122 is read out from the trailer section in the encoded file. The comparison apparatus then generates the two-dimensional matrix 121 and the overlap table 123, based on the dynamic dictionary 122.

The comparison apparatus two-dimensionally hashes a word subject to comparison and finds an element (position) in the two-dimensional matrix 121 by using a combination obtained by two-dimensionally hashing the word. When the identification flag of the pointer information in the position thus found is "0" (no overlapping), the comparison apparatus tracks a word pointing pointer contained in the pointer information and determines whether the word subject to comparison has been registered in the dynamic dictionary 122. If the word subject to comparison has been registered in the dynamic dictionary 122, the comparison apparatus outputs, as the result of the comparison, a dynamic code corresponding to the registered word.

For example, it is assumed here that the word subject to comparison is "Mickey". It is further assumed that the position in the two-dimensional matrix 121 is a position of (3, 1), and that the identification flag of the pointer information is "0". In this case, the comparison apparatus tracks the word pointing pointer contained in the pointer information, and identifies the word subject to comparison "Mickey" as having been registered in the buffer section in the dynamic dictionary 122. The comparison apparatus consequently outputs, as the result of the comparison, a dynamic code "A001h" corresponding to the registered word "Mickey".

In contrast, when the identification flag of the pointer information in the position thus found is "1" (overlapping), the comparison apparatus tracks the overlap table 123 pointing pointer contained in the pointer information. The comparison apparatus searches a management region indicated by the pointer thus tracked, and determines whether the word subject to comparison has been registered in the dynamic dictionary 122. If the word subject to comparison has been registered in the dynamic dictionary 122, the comparison apparatus outputs, as the result of the comparison, a dynamic code corresponding to the registered word. In this manner, even when making comparison with an input word, the comparison apparatus can acquire a dynamic code assigned thereto, without sequentially tracking the dynamic dictionary 122 and at high speed.

For example, it is assumed here that the word subject to comparison is "Minnie". It is further assumed that the position in the two-dimensional matrix 121 is a position of (5, 0), and the identification flag of the pointer information is "1". In this case, the verification apparatus tracks the overlap table 123 pointing pointer contained in the pointer information, and searches a management region indicated by the pointer. The comparison apparatus tracks a word pointing pointer contained in the first currently used ("0") field in the searched management region, and finds that the word subject to comparison "Minnie" has not been registered in the buffer section in the dynamic dictionary 122, The comparison apparatus tracks a word pointing pointer contained in the second currently used ("0") field in the searched management region, finds that the word subject to comparison "Minnie" has been registered in the buffer section in the dynamic dictionary 122, and outputs, as the result of the comparison, a dynamic code "A002h" corresponding to the registered word "Minnie". In this manner, even when making comparison of an input word, the comparison apparatus can acquire a dynamic code assigned thereto, without sequentially tracking the dynamic dictionary 122 and at high speed.

Configuration of Comparison Apparatus

Figure 10:
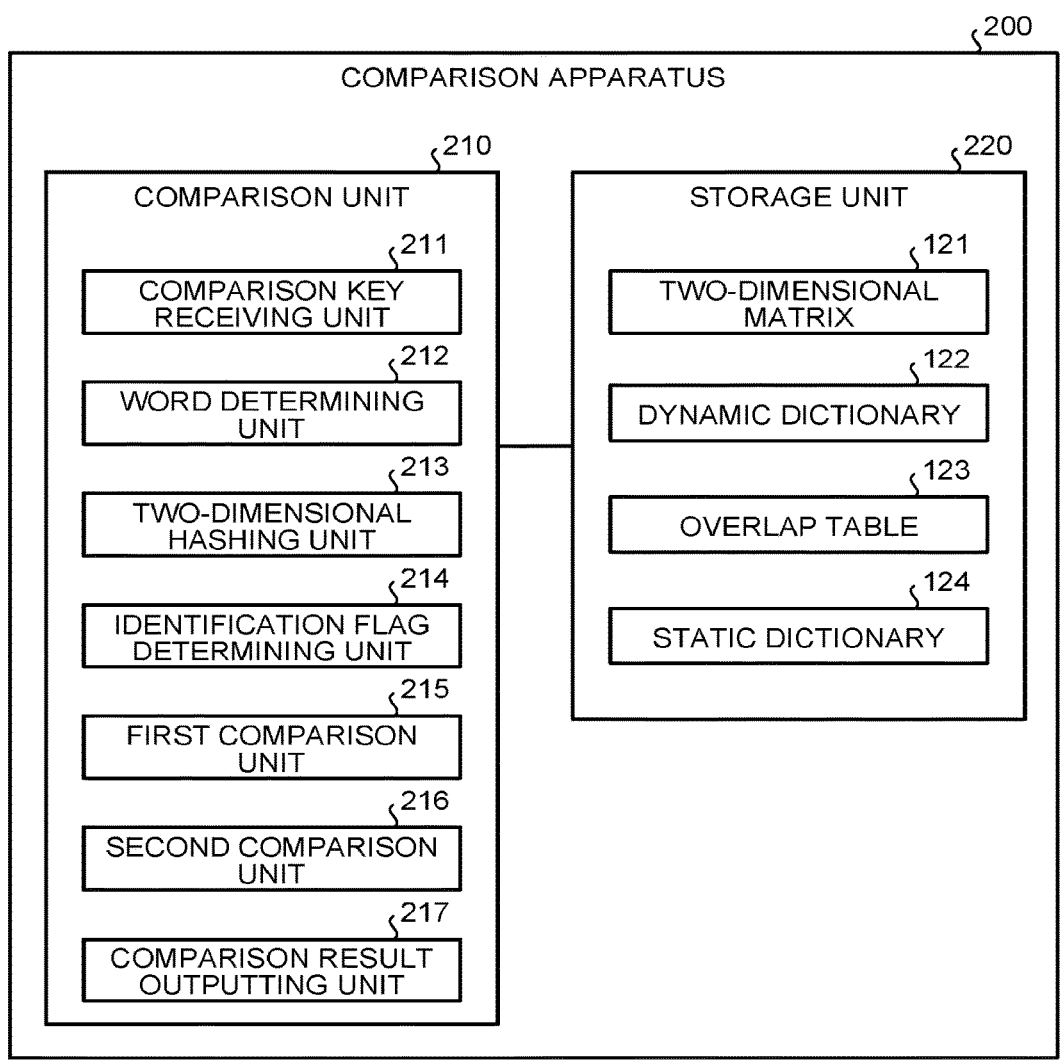
FIG. 10 is a functional block diagram illustrating the configuration of a comparison apparatus according to the embodiment.

FIG. 10 is a functional block diagram illustrating the configuration of the comparison apparatus according to the embodiment. As illustrated in FIG. 10, the comparison apparatus 200 includes a comparison unit 210 and a storage unit 220. Note that the storage unit 220 is configured in the same manner as the storage unit 120 illustrated in FIG. 4, and description of overlapping parts of and matters on the configuration is omitted herein.

The comparison unit 210 is a processing unit that executes the comparison process illustrated in FIG. 9. The comparison unit 210 includes a comparison key receiving unit 211, a word determining unit 212, a two-dimensional hashing unit 213, an identification flag determining unit 214, a first comparison unit 215, a second comparison unit 216, and a comparison result outputting unit 217.

The comparison key receiving unit 211 receives a comparison key. For example, the comparison key receiving unit 211 receives, as a comparison key, a word subject to comparison.

The word determining unit 212 determines whether the comparison key has been received in the static dictionary 124. The word determining unit 212 functions in the same manner as the word determining unit 112 illustrated in FIG. 4, and description thereof is omitted here.

The two-dimensional hashing unit 213 two-dimensionally hashes the comparison key. The two-dimensional hashing unit 213 functions in the same manner as the two-dimensional hashing unit 113 illustrated in FIG. 4, and description thereof is omitted here.

The identification flag determining unit 214 determines what an identification flag indicates in pointer information in a position, in the two-dimensional matrix 121, that is obtained by two-dimensionally hashing the comparison key. For example, the identification flag determining unit 214 determines whether an identification flag in the pointer information is "0" indicating that the combination of the remainders does not overlap with another. If determining that the identification flag in the pointer information is "0", the identification flag determining unit 214 outputs the comparison key to the first comparison unit 215. If determining that the identification flag in the pointer information is not "0", the identification flag determining unit 214 outputs the comparison key to the second comparison unit 216.

The first comparison unit 215 compares the comparison key with the dynamic dictionary 122 by using a word pointing pointer contained in the pointer information. For example, the first comparison unit 215 tracks the word pointing pointer contained in the pointer information, and determines whether the comparison key has been registered in the dynamic dictionary 122. If determining that the comparison key has been registered in the dynamic dictionary 122, the first comparison unit 215 outputs, to the comparison result outputting unit 217, a dynamic code corresponding to the registered word as the result of the comparison. If determining that the comparison key has not been registered in the dynamic dictionary 122, the first comparison unit 215 outputs, to the comparison result outputting unit 217, information that the comparison key has not been registered in the dynamic dictionary 122. When the word pointing pointer contained in the pointer information is at an initial value, it also means that the comparison key has not been registered in the dynamic dictionary 122. Consequently, the first comparison unit 215 outputs, to the comparison result outputting unit 217, information that the comparison key has not been registered in the dynamic dictionary 122.

The second comparison unit 216 compares the comparison key with the dynamic dictionary 122 by using an overlap table 123 pointing pointer contained in the pointer information. For example, the second comparison unit 216 tracks the overlap table 123 pointing pointer contained in the pointer information. The second comparison unit 216 searches a management region indicated by the pointer thus tracked, then tracks a word pointing pointer contained in a currently used field in the management region thus searched, and then determines whether the comparison key has been registered in the dynamic dictionary 122. If determining that the comparison key has been registered in the dynamic dictionary 122, the second comparison unit 216 outputs, to the comparison result outputting unit 217, a dynamic code corresponding to the registered word as the result of the comparison. If determining that the comparison key has not been registered in the dynamic dictionary 122, the second comparison unit 216 determines, by using a word pointing pointer contained in another currently used field in the management region thus searched, whether the comparison key has been registered in the dynamic dictionary 122. The second comparison unit 216 then tracks the word pointing pointer contained in this other currently used field, and, if determining that the comparison key has been registered in the dynamic dictionary 122, the second comparison unit 216 outputs, to the comparison result outputting unit 217, a dynamic code corresponding to the registered word as the result of the comparison. After tracking word pointing pointers contained in all of the currently used fields, if determining that the comparison key has not been registered in the dynamic dictionary 122, the second comparison unit 216 outputs, to the comparison result outputting unit 217, information that the comparison key has not been registered in the dynamic dictionary 122.

The comparison result outputting unit 217 outputs the result of the comparison. For example, upon receiving a dynamic code from the first comparison unit 215 or the second comparison unit 216, the comparison result outputting unit 217 outputs the received dynamic code as a comparison result. Upon receiving, from the first comparison unit 215 or the second comparison unit 216, information that the comparison key has not been registered in the dynamic dictionary 122, the comparison result outputting unit 217 outputs, as a comparison result, "NG" indicating that the comparison key has not been registered in the dynamic dictionary 122.

Flowchart for Comparison Process

Figure 11:
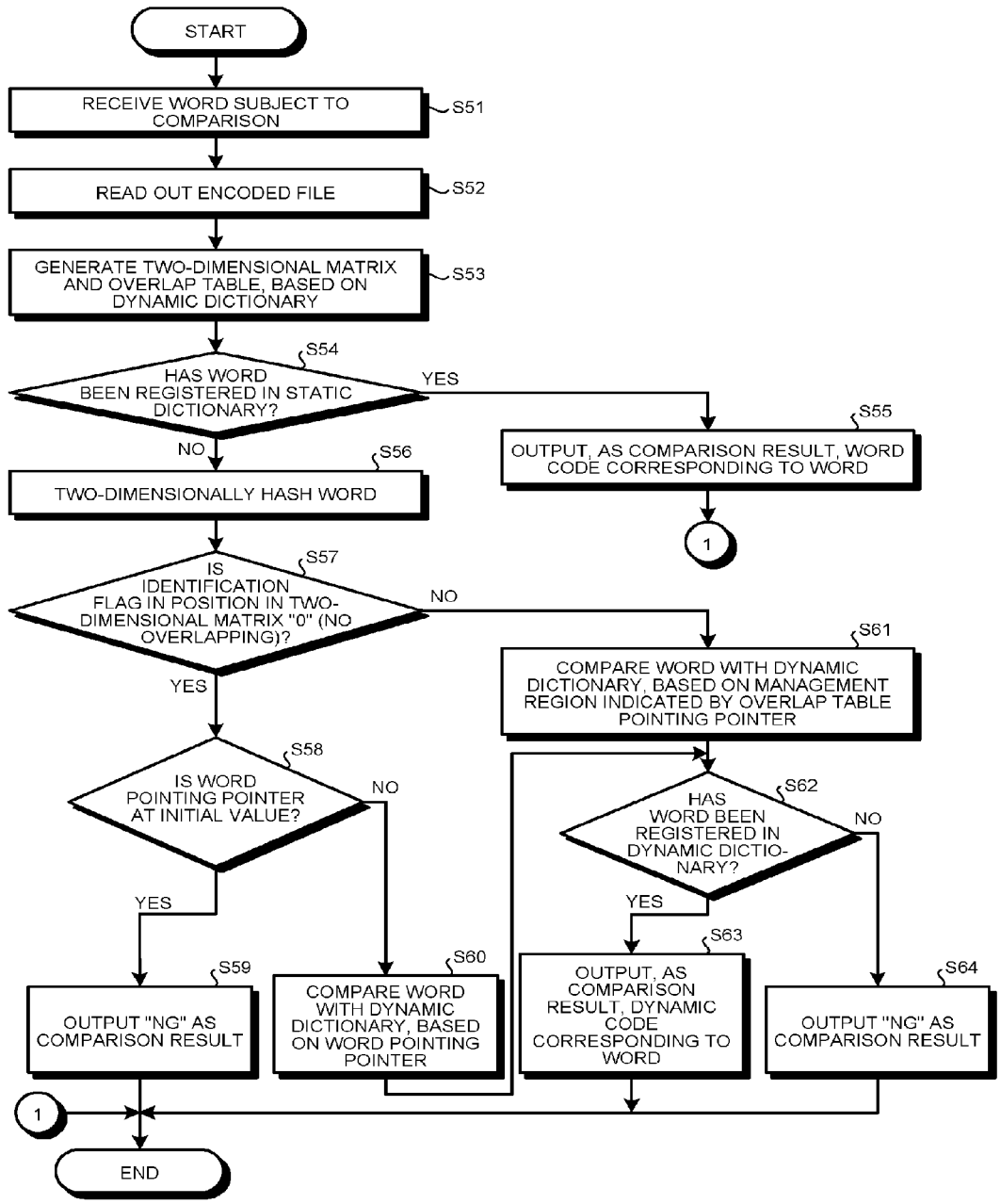
FIG. 11 is a diagram illustrating an example of a flowchart for the comparison process according to the embodiment.

FIG. 11 is a diagram illustrating an example of a flowchart for the comparison process according to the embodiment.

At the start, the comparison apparatus 200 receives a comparison key (a word subject to comparison) (step S51). In response, the comparison apparatus 200 reads out an encoded file into a storage area for comparison (step S52). The comparison apparatus 200 generates a two-dimensional matrix 121 and an overlap table 123, based on a dynamic dictionary 122 stored in the trailer section of the encoded file (step S53).

The comparison apparatus 200 determines whether a word subject to comparison has been registered in the static dictionary 124 (step S54). For example, the comparison apparatus 200 determines whether the static dictionary 124 contains any basic word that is identical to the word subject to comparison.

If determining that the word subject to comparison has been registered in the static dictionary 124 (Yes at step S54), the comparison apparatus 200 outputs, as the result of the comparison, a word code corresponding to the registered word (step S55). The comparison apparatus 200 then ends the comparison process.

On the other hand, if determining that the word subject to comparison has not been registered in the static dictionary 124 (No at step S54), the comparison apparatus 200 two-dimensionally hash the word subject to comparison (step S56). For example, the comparison apparatus 200 performs the same two-dimensional hashing as the encoding apparatus 100 performs. That is, the comparison apparatus 200 A-hashes and B-hashes the word subject to comparison.

Subsequently, the comparison apparatus 200 finds a matrix element (position), in the two-dimensional matrix 121, that corresponds to a combination obtained by the two-dimensional hashing. The comparison apparatus 200 then determines whether an identification flag in pointer information placed in the position thus found is "0" (no overlapping) (step S57). If determining that the identification flag in the pointer information is "0" (Yes at step S57), the comparison apparatus 200 determines whether a word pointing pointer in the pointer information is at an initial value (step S58).

If determining that the word pointing pointer is at the initial value (Yes at step S58), the comparison apparatus 200 outputs "NG" as a comparison result (step S59). The comparison apparatus 200 then ends the comparison process.

On the other hand, if determining that the word pointing pointer is not at the initial value (No at step S58), the comparison apparatus 200 compares the word subject to comparison with the dynamic dictionary 122, based on the word pointing pointer (step S60). For example, the comparison apparatus 200 tracks the word pointing pointer and determines whether the word subject to comparison has been registered in the dynamic dictionary 122. The comparison apparatus 200 then proceeds to step S62.

If determining, at step S57, that the identification flag in the pointer information is not "0" (No at step S57), the comparison apparatus 200 compares the word subject to comparison with the dynamic dictionary 122, based on a management region indicated by a pointer to an overlap table (step S61). For example, the comparison apparatus 200 tracks an overlap table 123 pointing pointer contained in the pointer information. The comparison apparatus 200 searches a management region indicated by the pointer thus tracked, then tracks a word pointing pointer contained in a currently used field in the management region thus searched, and then determines whether the word subject to comparison has been registered in the dynamic dictionary 122. The comparison apparatus 200 then proceeds to step S62.

At step S62, the comparison apparatus 200 determines, as a result of the comparison, whether the word subject to comparison has been registered in the dynamic dictionary 122 (step S62). If determining that the word subject to comparison has been registered in the dynamic dictionary 122 (Yes at step S62), the comparison apparatus 200 outputs, as the result of the comparison, a dynamic code corresponding to the registered word (step S63). The comparison apparatus 200 then ends the comparison process.

On the other hand, if determining that the word subject to comparison has not been registered in the dynamic dictionary 122 (No at step S62), the comparison apparatus 200 outputs "NG" as a comparison result (step S64). The comparison apparatus 200 then ends the comparison process.

In this manner, even when making comparison of an input word, the comparison apparatus 200 can acquire a dynamic code assigned thereto, without sequentially tracking the dynamic dictionary 122 and at high speed.

Hardware Configuration of Information Processing Apparatus

Figure 12:
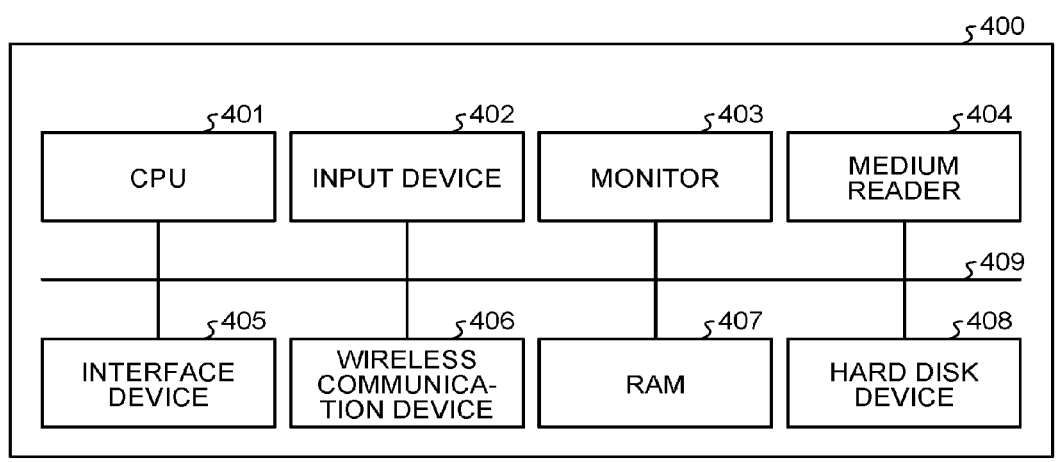
FIG. 12 is a diagram illustrating the hardware configuration of an information processing apparatus in the embodiment.

The hardware configuration of an information processing apparatus that includes the encoding apparatus 100 and the comparison apparatus 200 in the embodiment is described with reference to FIG. 12. FIG. 12 is a diagram illustrating the hardware configuration of an information processing apparatus in the embodiment. As illustrated in FIG. 12, a computer 400 includes a central processing unit (CPU) 401 that executes various kinds of processing, an input device 402 that accepts input of data from a user, and a monitor 403. The computer 400 further includes a medium reader 404 that reads out a program or the like from a storage medium, an interface device 405 to be used for connection with another apparatus, and a wireless communication device 406 to be used for wireless connection to another apparatus. The computer 400 further includes a random access memory (RAM) 407 that temporarily stores various kinds of information, and a hard disk device 408. In addition, the individual devices 401 to 408 are connected to a bus 409.

In the hard disk device 408, a search program is stored that has the same functions as, for example, the word determining unit 112, the two-dimensional hashing unit 113, the identification flag determining unit 114, the first encoding unit 115, and the second encoding unit 116 as illustrated in FIG. 4. In the hard disk device 408, various data to be used for implementing an encoding program is stored.

The CPU 401 reads out various computer programs stored in the hard disk device 408 and deploys and executes the computer programs on the RAM 407, thereby performing various processes. These programs enable the computer 400 to function as, for example, the word determining unit 112, the two-dimensional hashing unit 113, the identification flag determining unit 114, the first encoding unit 115, and the second encoding unit 116 which are illustrated in FIG. 4.

The above search program does not need to be stored in the hard disk device 408. For example, the program may have been stored in a storage medium that can be read by the computer 400 and be read out and executed by the computer 400. Examples of the storage medium that can be read by the computer 400 include; portable storage media such as a compact disc read-only memory (CD-ROM), a digital versatile disc (DVD), and a universal serial bus (USB) memory; semiconductor memories such as a flash memory; and a hard disk drive. Furthermore, the program may have been stored in an apparatus connected to a public line, the Internet, a local area network (LAN), or the like, and be read out therefrom and executed by the computer 400.

Figure 13:
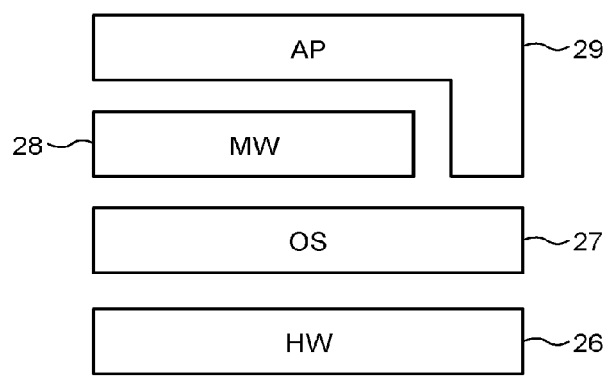
FIG. 13 is a diagram illustrating an exemplary configuration of a computer program that runs on a computer.

FIG. 13 is a diagram illustrating an exemplary configuration of a computer program that runs on a computer. On the computer 400, an operating system (OS) 27 that controls a hardware group 26 (401 to 409) illustrated in FIG. 13 to run. The hardware group 26 is controlled and managed with the CPU 401 running by a procedure according to the OS 27, the hardware group 26 executes processes according to an application program 29 and middleware 28. Furthermore, on the computer 400, the middleware 28 or the application program 29 is executed by the CPU 401 after being read out into the RAM 407.

When the CPU 401 has received a word to be encoded, processes based on at least a part of the middleware 28 or the application program 29 are performed, so that encoding functions of the encoding unit 110 are implemented (by having the processes performed with the hardware group 26 controlled based on the OS 27). The encoding function may be included in the application program 29 or may be a part of the middleware 28 that is executed by being called in accordance with the application program 29.

One implementation can speed up comparison with a list for encoding strings.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium storing therein an encoding program that causes a computer to execute a process comprising:
   registering, in a dynamic dictionary, strings in input text data that are not contained in a static dictionary;
   adding, to first hashed data obtained by individually N-dimensionally hashing words contained as registered items in the static dictionary, hashed data obtained by individually hashing strings registered in the dynamic dictionary;
   determining, by using the first hashed data, whether each input string has been registered in the static dictionary and whether the string has been registered in the dynamic dictionary; and
   in accordance with a result of the determining, performing encoding based on a content registered in the static dictionary or the dynamic dictionary.

2. The computer-readable recording medium according to claim 1, wherein the adding includes, when a piece of the first hashed data obtained by N-dimensionally hashing words collides with another, registering the piece of the first hashed data in an overlap table.

3. The computer-readable recording medium according to claim 2, wherein, the adding includes, when the overlap table is full, transferring the first hashed data to another overlap table having a larger capacity.

4. The computer-readable recording medium according to claim 1, wherein the first hashed data is hashed data obtained by N-dimensionally hashing words, where N is at least 2.

5. The computer-readable recording medium according to claim 2, wherein, the adding includes securing, in the overlap table, a region to be used for managing data with respect to each piece of the first hashed data.

6. An encoding apparatus comprising:
   a processor; and
   a memory, wherein the processor executes:
   registering, in a dynamic dictionary, strings in input text data that are not contained in a static dictionary;
   adding, to first hashed data obtained by individually N-dimensionally hashing words contained as registered items in the static dictionary, hashed data obtained by individually hashing strings registered in the dynamic dictionary;
   determining, by using the first hashed data, whether each input string has been registered in the static dictionary and whether the string has been registered in the dynamic dictionary; and
   in accordance with a result of the determining, performing encoding based on a content registered in the static dictionary or the dynamic dictionary.

7. An encoding method to be performed by a computer, the method comprising:
   registering, in a dynamic dictionary, strings in input text data that are not contained in a static dictionary using a processor;
   adding, to first hashed data obtained by individually N-dimensionally hashing words contained as registered items in the static dictionary, hashed data obtained by individually hashing strings registered in the dynamic dictionary using the processor;
   determining, by using the first hashed data, whether each input string has been registered in the static dictionary and whether the string has been registered in the dynamic dictionary using the processor; and
   in accordance with a result of the determining, performing encoding based on a content registered in the static dictionary or the dynamic dictionary using the processor.

8. A non-transitory computer-readable recording medium storing therein a comparison program that causes a computer to execute a process comprising:
   calculating hashed data into which an input word is hashed; and
   by using the calculated hashed data as a comparison key and using first hashed data obtained by individually N-dimensionally hashing words contained as registered items in a static dictionary and in a dynamic dictionary in which strings not contained in the static dictionary are registered, determining whether the input word has been registered in the static dictionary and whether the input word has been registered in the dynamic dictionary.

9. A comparison apparatus comprising:
   a processor; and
   a memory; and wherein the processor executes:
   calculating hashed data into which an input word is hashed; and
   by using the calculated hashed data as a comparison key and using first hashed data obtained by individually N-dimensionally hashing words contained as registered items in a static dictionary and in a dynamic dictionary in which strings not contained in the static dictionary are registered, determining whether the input word has been registered in the static dictionary and whether the input word has been registered in the dynamic dictionary.

10. A comparison method to be performed by a computer, the method comprising:
    calculating hashed data into which an input word is hashed using a processor; and
    by using the calculated hashed data as a comparison key and using first hashed data obtained by individually N-dimensionally hashing words contained as registered items in a static dictionary and in a dynamic dictionary in which strings not contained in the static dictionary are registered, determining whether the input word has been registered in the static dictionary and whether the input word has been registered in the dynamic dictionary using the processor.

* * * * *